(12) United States Patent
Asente et al.

(10) Patent No.: US 11,093,660 B2
(45) Date of Patent: Aug. 17, 2021

(54) RECOMMENDING PATTERN DESIGNS FOR OBJECTS USING A SEQUENCE-BASED MACHINE-LEARNING MODEL

(71) Applicant: Adobe Inc., San Jose, CA (US)

(72) Inventors: Paul Asente, Redwood City, CA (US); Jingwan Lu, Santa Clara, CA (US); Huy Phan, Bao Loc (VN)

(73) Assignee: ADOBE INC., San Jose, CA (US)

( * ) Notice: Subject to any disclaimer, the term of this patent is extended or adjusted under 35 U.S.C. 154(b) by 1524 days.

(21) Appl. No.: 14/968,870

(22) Filed: Dec. 14, 2015

(65) Prior Publication Data
US 2017/0169340 A1  Jun. 15, 2017

(51) Int. Cl.
*G06F 30/00* (2020.01)
*G06N 7/00* (2006.01)

(52) U.S. Cl.
CPC ............ *G06F 30/00* (2020.01); *G06N 7/005* (2013.01)

(58) Field of Classification Search
CPC ...... G06F 16/35; G06F 16/56; G06F 16/5866; G06F 16/7335; G06F 16/78; G06F 16/7837; G06F 16/9535; G06F 3/04842; G06F 3/0488; G06F 17/2765; G06F 40/279; G06K 9/00664; G06K 9/00671; G06K 9/00711; G06K 9/22; G06K 9/3241; G06T 11/00; G06T 11/60; G06T 2207/10004; G06T 2207/10016; G06T 2207/20076; G06T 7/20; G06T 7/70
See application file for complete search history.

(56) References Cited

U.S. PATENT DOCUMENTS

| | | | |
|---|---|---|---|
| 6,271,859 B1* | 8/2001 | Asente | G06T 11/001 345/589 |
| 2015/0178930 A1* | 6/2015 | Gao | G06F 16/5866 382/103 |
| 2016/0356665 A1* | 12/2016 | Felemban | G01M 3/2807 |

OTHER PUBLICATIONS

Xiqun Lu, "Joint Distributions based on FB and Guassian Mixtures for Evaluation of Style Simimlarity among Paintings," IEEE ICPR'06 (2006) (Year: 2006).*
Lu et al., "DecoBrush: Drawing Structured Decorative Patterns by Example," ACM (2014) (Year: 2014).*
Garces et al., "A Similarity Measure for Illsutration Style," ACM (2014) (Year: 2014).*

(Continued)

*Primary Examiner* — Baboucarr Faal
*Assistant Examiner* — Kevin L. Smith
(74) *Attorney, Agent, or Firm* — Keller Jolley Preece

(57) ABSTRACT

Methods and systems for aiding users in generating object pattern designs with increased speed. In particular, one or more embodiments train a sequence-based machine-learning model using training objects, each training object including a plurality of regions with a plurality of design elements. One or more embodiments identify a plurality regions of an object with a first region adjacent a second region. One or more embodiments receive a user selection of a design element for populating the first region with a first design element from a plurality of design elements. One or more embodiments identify a second design element from the plurality of design elements based on the first design element using the trained sequence-based machine-learning model. One or more embodiments also populate the second region with one or more instances of the second design element.

20 Claims, 16 Drawing Sheets

(56) References Cited

OTHER PUBLICATIONS

Phan et al., "Patternista: Learning Element Style Compatibility and Spatial Composition for Ring-based Layout Decoration," Eurographics Association (2016) (Year: 2016).*
Okabe et al., "Paintbrush rendering of lines using HMMs", ACM (2005) (Year: 2005).*
Yeh et al., "Systhesis of Tiled Patterns using Factor Graphs,"ACM (2013) (Year: 2013).*
Meese et al., "From Codes to Patterns: Designing Interactive Decoration for Tableware." ACM (2013) (Year: 2013).*
Jingwan Lu, "Data-Driven Digital Drawing and Painting," Dissertation (Jun. 2014) (Year: 2014).*
Lang et al., "The Markov Pen: Online Synthesis of Free-Hand Drawing Styles," Expressive 2015 (Jun. 18, 2015) (Year: 2015).*

\* cited by examiner

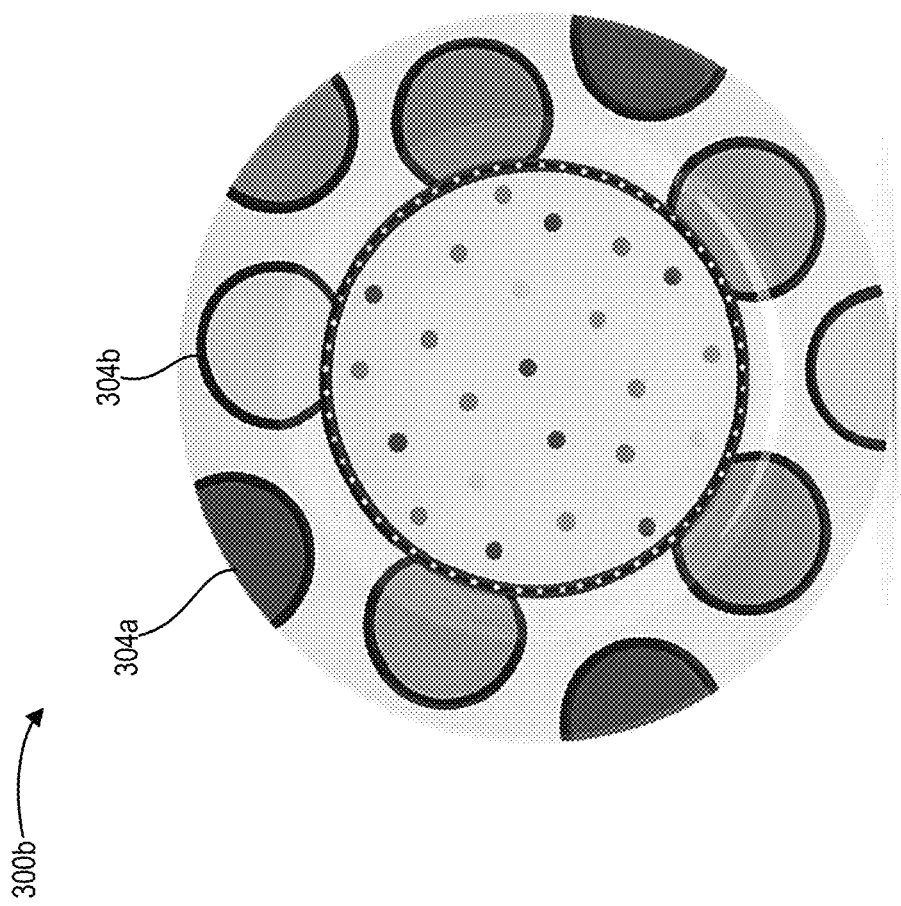

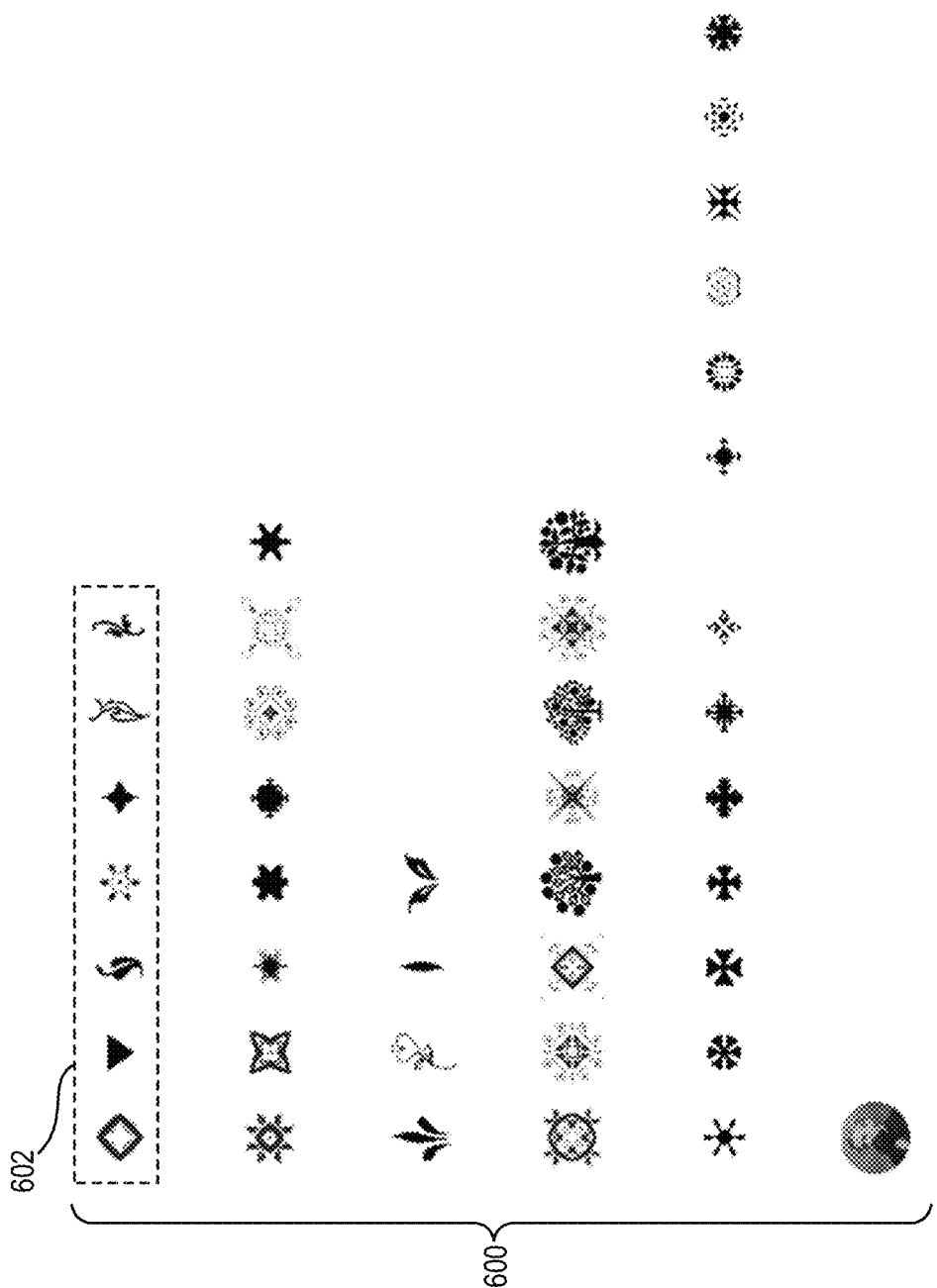

RECOMMENDING PATTERN DESIGNS FOR OBJECTS USING A SEQUENCE-BASED MACHINE-LEARNING MODEL

BACKGROUND

1. Technical Field

One or more embodiments relate generally to systems and methods for designing object patterns. More specifically, one or more embodiments of the present invention relate to systems and methods of using a sequence-based machine-learning model to generate object pattern designs.

2. Background and Relevant Art

Turntable objects (e.g., ceramic objects created on a pottery wheel) often include designs or patterns using multiple design elements with specific visual characteristics. In particular, turntable objects often include multiple regions, each region having a distinct pattern or design (e.g., floral and/or geometric patterns of individual design elements). For example, an object such as a plate can include a plurality of concentric circle regions that extend outward from a center of the plate. By including distinct, but related, design elements in each of the regions of an object, an artist or decorator can provide an overall aesthetic to the object.

Design decisions such as style compatibility and visual composition of the design elements within each region influence the overall aesthetic of a final design. A single design decision can have a large effect on a final design aesthetic. For example, a design decision selecting a particular style of design element, or a design decision to use a particular composition can drastically affect the overall aesthetic of the final design. Therefore, various conventional design systems have attempted to aid a user in selecting the style and/or composition of design elements to improve a user's ability to produce a quality overall design.

Many conventional design systems, however, have limited capabilities that often lead to unsatisfactory results. For example, some conventional design systems use a retrieval approach to provide design recommendations to a user. A retrieval approach often uses a score function to assign scores to pre-configured designs in a database, and then typically recommends the designs with the highest scores to the user. Therefore, although retrieval approaches are relatively easy to implement, such approaches are limited to the pre-configured designs in the database.

In addition, many conventional design systems fail to provide a user with the ability to control various design decisions. For instance, and as mentioned above, retrieval approaches are inherently limited to a finite number of pre-configured designs. Accordingly, a user is also limited to design decisions that incorporate the pre-configured designs. As such, conventional design systems often frustrate a user that desires to have more control over the design decisions that affect an overall aesthetic of the design.

Moreover, due to using pre-configured designs, most conventional design systems are not capable of producing new or novel design configurations. In particular, conventional design systems do not have the capacity to create a novel design configuration using a design element. As such, conventional design systems often produce overall designs that appear generic. Furthermore, overtime conventional design systems often produce results that appear repetitive and mundane to a user.

These and other disadvantages may exist with respect to conventional design recommendation techniques.

SUMMARY

Introduced here are techniques/technology for generating and recommending pattern designs for objects. For example, one or more embodiments included systems and methods to train a sequence-based machine-learning model to detect and analyze various design characteristics from a set of training objects. In particular, one or more embodiments train the model by detecting design characteristics (e.g., design elements, composition, density, etc.) in different regions of a training object from the set of training objects, and generating state values for the regions based on the detected design characteristics. By generating state values for various regions of each training object in a set of training objects, one or more embodiments provide a sequence-based machine-learning model capable of identifying compatible design characteristics to apply to one or more regions of a new object.

Additionally, the systems and methods provide design recommendations for new objects based on a user-selected design element. Specifically, one or more embodiments identify a first region and a second region of an object. In addition, the systems and methods populate the first region with a user-selected first design element and determine a state value for the first region based at least in part on the user-selected first design element. Using a sequence-based machine-learning model, the systems and methods then generate a state value for the second region based on the first state value, and use the second state value to identify a second design element with which the second region is populated. Due to the relationship between the first state value and the second state value, as provided by the machine-learning model, the systems and methods provide novel design recommendations that are compatible with a user-selected design element.

In addition to recommending at least one design element to populate in a particular region of a new object, the systems and methods provide additional design characteristic recommendations. For example, based on the relationship between the first state value and the second state value, as determined by the sequence-based machine-learning model, the systems and methods recommend at least one of a style, composition, density, and/or size of a design element within a particular region of a new object. Thus, one or more embodiments assist a user in quickly designing a new object with a novel design, as well as providing an overall final design having a consistent and artistic overall design aesthetic.

Additional features and advantages of one or more embodiments of the present disclosure will be set forth in the description which follows, and in part will be obvious from the description, or may be learned by the practice of such example embodiments.

BRIEF DESCRIPTION OF THE DRAWINGS

Various embodiments will be described and explained with additional specificity and detail through the use of the accompanying drawings in which:

FIGS. 3A-3D illustrate a series of images of various embodiments of composition characteristics for design elements in accordance with one or more embodiments;

FIG. 6 illustrates a plurality of groups of design elements in accordance with one or more embodiments;

DETAILED DESCRIPTION

Figure 1:
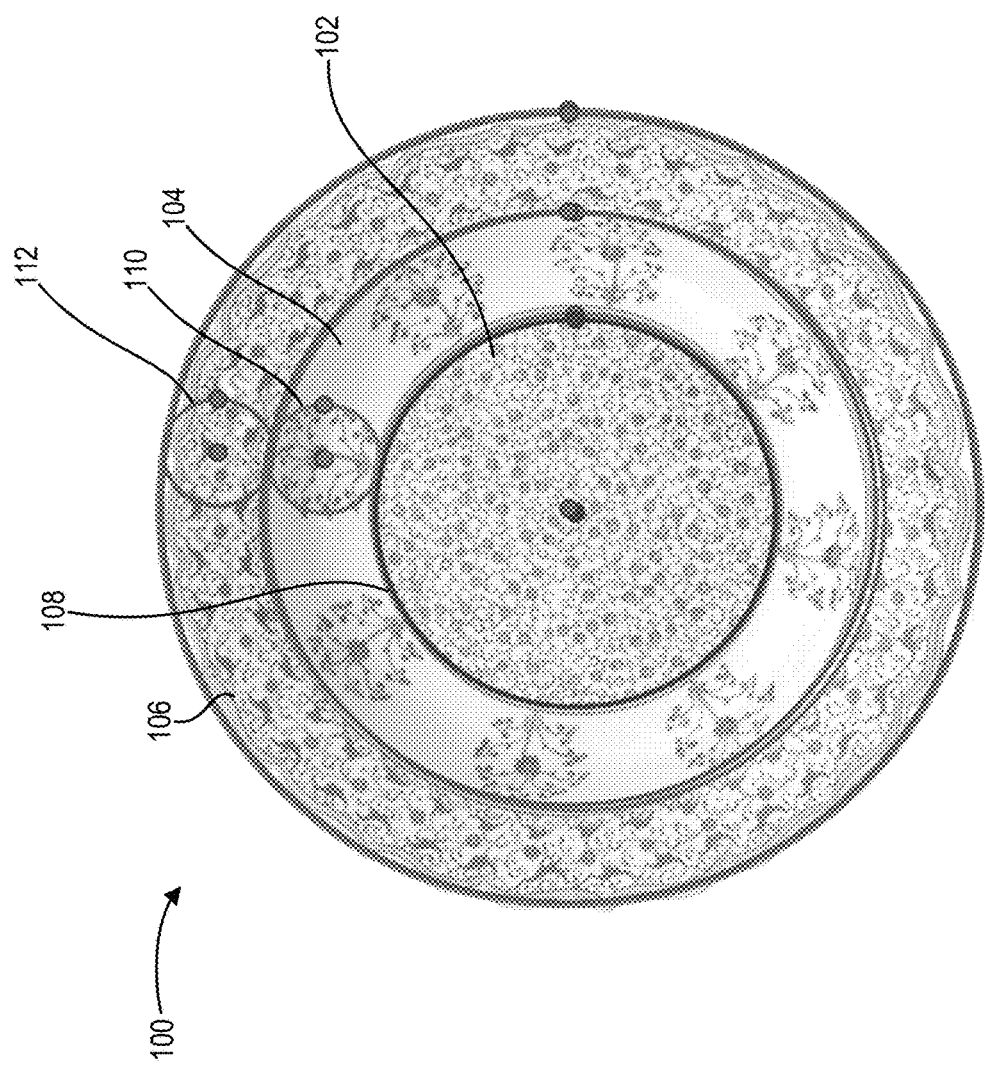
FIG. 1 illustrates an image of an object with a plurality of design elements in a plurality of regions in accordance with one or more embodiments.

One or more embodiments of the present disclosure include an object design system that provides recommendations for designing objects. Specifically, the object design system is useful for providing design recommendation for turntable objects such as bowls, plates or vases. In one or more embodiments, the object design system receives a user selection of a design element to include in a region of an object. The object design system, based on the user-selected element and using a trained machine-learning model, provides recommendations for design elements to include in one or more other regions of an object. In particular, the object design system can recommend design elements that are stylistically compatible with the user-selected design element.

In addition, and using the trained machine-learning model, the object design system recommends various design characteristics to apply to a design element (e.g., either a user-selected design element or a recommended design element). For example, the object design system determines a composition to apply to a design element for a specific region (e.g., the arrangement of a design element within a region). In addition, the object design system determines the size of the design element, the density of the design element within region, and various other characteristics as explained below in further detail.

In one or more embodiments, the object design system trains a sequence-based machine-learning model using a set of training objects. For example, for each training object in a set of training objects, the object design system identifies a plurality of regions that include design elements. In particular, the object design system detects a design element in each region of an object to identify characteristics of the design elements and determine how the design elements relate to each other. Accordingly, the object design system can train the machine-learning model to identify relationships between design elements and/or design characteristics in adjacent regions based on analyzing a set of training objects.

In one or more embodiments, the object design system generates state values for each of the regions to define identified relationships between design elements and/or design characteristics in adjacent regions. For example, the object design system generates state values using a Markov model. A Markov model is a statistical or probability model that can be used to model seemly random systems. In particular, a Markov model can model a system by defining a state of the system, where it is assumed that a future state is dependent on a previous state. A Markov model, therefore, is particularly well-suited for use in the object design system when one realizes that an object design can be segmented into various regions, where each region is treated as a state within a Markov model. When viewing an object design from a Markov model perspective, a Markov model can identify relationships between design regions of an object design (i.e., state values). Accordingly, a Markov model uses the identified relationships between regions of an object design (i.e., state values) to generate a novel design for a region (i.e., generate output based on the state values).

There are several different types of Markov models that are used in different situations. In particular, Markov models can be categorized into two groups: observable states and hidden states. For example, when a system lends itself to observing the system state, then a Markov model from the observable states category can be used. However, in other systems it is not practical or possible to observe the system state, and thus a hidden state model can be used to generate output from non-observable states. In other words, the output that is generated from the model is visible, but the system states on which the output depends are not visible, or hidden.

In one or more embodiments described herein, the object design system uses a hidden Markov model. As mentioned above, a hidden Markov model is a type of Markov model that utilizes state values that are not visible to an observer (e.g., hidden state values), to produce observable or visible output dependent on the state values. For example, when modeling an object design having two or more regions, a hidden Markov model can generate a state value representing the overall design of a particular region of an object. In such an implementation, a state value can represent the overall design aesthetic of regions including, but not limited to, design element characteristic(s), the frequency of the design element, the pattern of the design element, and/or additional design characteristics of the region as explained for fully below. In contrast to the state values that represent the overall design of a region, the actual design elements and design characteristics of a design region are observable output. Accordingly, the object design system uses a hidden Markov model to model the design of an object by using hidden state values representing an overall design aesthetic to generate observable output in the form of selecting actual design elements and/or design characteristics for one or more additional regions. The term "state value(s)" or "hidden state value(s)" are used interchangeably throughout the specification to refer to state value(s) within a hidden Markov model.

To illustrate, the object design system can generate a state value for each region based on the composition and style of the corresponding design elements (e.g., by concatenating values or running the values through an algorithm). The object design system can then train the hidden Markov model to identify similar or compatible design elements based on the state values of adjacent regions in each training object of a set of training objects. Thus, the machine-learning model using a hidden Markov model can recommend existing or novel design elements and design characteristics based on the aesthetics of training objects used to train the model.

According to one or more additional embodiments, after training the machine-learning model, the object design system provides recommendations to a user for populating one or more regions of an object. First, a user can select a design element from a plurality of design elements to populate a first region of an object. Additionally, the user can select a composition of the design element in the first region (e.g., how the selected design element will appear within the region). Alternatively, the object design system can recommend a composition of the design element in the first region. The object design system then populates the region with the selected design element in accordance with the identified composition.

After the user selects the design element and/or after the object design system populates the first region, the object design system selects a second design element to populate a second region of the object. In particular, the object design system can generate a first state value for the first region based at least in part on the user-selected design element. Based on the first state value, the object design system uses the machine-learning model to generate a second state value for the second region. The object design system then selects a second design element and one or more design characteristics to apply to the second design element for the second region in accordance with the second state value. To illustrate, the object design system identifies a second design element that has a style that is compatible with the style of the first design element. In addition, the object design system determines one or more design characteristics that are compatible with design characteristics of the first design element in the first region.

Additionally, one or more embodiments of the object design system identifies additional design elements and design characteristics for additional regions in association with the first region and/or the second region. For example, for a third region adjacent the second region (which is, in turn, adjacent the first region), the object design system uses the machine-learning model to generate a third state value to identify a third design element and design characteristics to apply in the third region. The object design system can thus recommend as many design elements as there are regions for an object based on a single user-selected design element.

As used herein, the term "design element" refers to a graphical element for the object design system to use in designing objects. Specifically, the object design system can use one or more design elements from a plurality of design elements to populate an empty region of an object. For example, design elements can include, but are not limited to, predefined design elements, user-generated design elements, and design elements that the object design system has designed based on predefined or user-generated design elements. Additionally, the object design system can use a single instance of a design element or a plurality of instances of a design element to populate a given region.

As used herein, the term "state value" refers to a value representing a region of an object. In particular, a state value can include a numerical value based on one or more characteristics of a design element. For example, a state value can be based on a composition and a style of the design element. Additionally, a state value can be based on one or more characteristics of the region, such as a location or size of the region, or other regions adjacent to the region. As mentioned above, the term state value is a hidden value in a hidden Markov model.

As used herein, the term "sequence-based machine-learning model" refers to a model that labels values to be sequentially dependent upon each other. Specifically, a sequence-based machine-learning model performs sequence labeling such that a given value is dependent on adjacent values. For example, a sequence-based machine-learning model trained on design elements from a set of training objects recommends a design element for a region of an object to be dependent on design elements in regions immediately adjacent to the region. In one example, a sequence-based machine-learning model is a hidden Markov model.

As mentioned, turntable objects often include a plurality of designs in different regions that lend a particular aesthetic to the object. To achieve the particular aesthetic for the object, the design elements in the different regions often include a similar style or "feel," while also being distinct from each other. Training a machine-learning model to recognize certain styles by certain artists or in connection with styles from certain time periods can allow the object design system to aid a user in designing new objects that may fit one or more of the learned styles. For example, the object design system uses the machine-learning model to provide recommendations to a user for decorating an object based on input from the user in relation to the object. To illustrate, training the machine-learning model to recognize relationships between regions and corresponding design elements allows the object design system to provide recommendations with a consistent overall feel for a plurality of distinct regions of an object. Thus, the machine-learning model identifies characteristics of a user-selected design element in a region of an object and provides recommendations of design elements that are consistent with the style or feel for one or more other regions of the object.

The object design system can use a set of training objects including a plurality of objects, such as turntable objects, to train the machine-learning model. FIG. 1 illustrates an image of an existing training object 100 from a set of training objects. Specifically, the set of training objects includes any number of objects used to train a machine-learning model. For example, the object design system can train the machine-learning model based on design elements on each of the training objects. For example, the training object 100 of FIG. 1 is a plate that has a plurality of separate regions that include design elements. Although FIG. 1 illustrates a turntable object (i.e., a plate), the training object 100 can be any object with a plurality of different regions with design elements.

In one or more embodiments, the training object 100 includes a plurality of regions 102, 104, 106 that are concentric circles. The object design system identifies the regions based on the visual characteristics of the regions. For example, the object design system determines that each region has a visible border based on white space, changes in patterns, or physical features of the training object 100. To illustrate, the object design system can determine that the object of FIG. 1 has three defined regions: a first region 102 in the center of the training object 100; a second region 104 adjacent to, and surrounding, the first region 102; and a third region 106 adjacent to, and surrounding, the second region 104. Thus, the object design system determines that the second region 104 is adjacent to the first region 102 and the third region 106, and that the first region 102 is not adjacent to the third region 106. As described in more detail below, whether a given region is adjacent to another region affects the machine-learning model.

To train the model using the training objects, the object design system identifies design elements in the different regions of an object. Specifically, to train the model using a set of training objects, the object design system uses image processing to identify regions of an object, analyze design element(s) and/or design characteristics in each of the different design regions of the object, and characterize the analyzed design elements and/or design characteristics. As used herein, image processing refers to a computer-based image processing technique that captures a visual representation of an object, analyzes the visual representation of the object, and characterizes the design of object based on the analysis of the visual representation of the object. In one or more embodiments, after a user provides an object for training, the object design system performs image processing on the object without additional user input.

As briefly mentioned above, the object design system can use image processing to identify regions of an object. For example, using image processing, the object design system can create a computer-based visual representation of the object. The object design system can then analyze the visual representation of the object to identify regions of the object that include particular design elements. The object design system, for example, identifies design elements and patterns of design elements to segment the surface area of an object into defined regions, where each of the defined regions includes a consistent design. For instance, a plate may have a single design element in the center of the plate. The plate may also have another design element that repeats in a radial pattern around the outside edge of the plate. In this example, the image processing of the object design system can identify the area around the design element in the center of the plate as a first region, and in addition, define the annular area around that includes the outside edge of the plate as a second region. Additional detail regarding the identification of regions will be discussed further below with reference to FIGS. 3A-3D.

In one or more embodiments, after identifying the regions of an object, the object design system identifies design elements, design element features, and/or other design characteristics in each region. For example, the object design system uses image processing to determine visual characteristics of a design element on an object that allow the object design system to categorize the design elements. As will be explained in additional detail below, the object design system can categorize design elements to allow for selecting design elements that complement each other to produce a pleasing overall design. In addition to categorizing design element(s) of a region, the object design system can identify one or more design characteristics of the region, that include, but are not limited to, frequency, number of design elements, pattern, position, and other design characteristics as described further below with respect to FIGS. 3A-3D. In one or more alternative embodiments, the object design system identifies the design elements and design characteristics based on manual user input or based on a combination of manual user input and image processing. To illustrate, a user first can identify the various regions of a training object (e.g., by selecting an area of an object using a select-and-drag gesture). Furthermore, the user then identifies the design elements in each region by manually selecting the design elements and marking the design elements for identification and analysis by the object design system. Additionally, the user can manually label the design elements and/or design characteristics so that the HMM analyses by the object design system uses the corresponding labels. In other embodiments, the object design system uses a combination of manual user input and automatic design element recognition.

Regardless a particular method for analyzing a set of training objects, the object design system identifies design characteristics of a training object. For example, and as illustrated in FIG. 1, the object design system identifies a first design element 108 in the first region 102, a second design element 110 in the second region 104, and a third design element 112 in the third region 106. As shown, the training object 100 includes different patterns in each region including one or more different design elements. Although the design elements in each region are distinct, the design elements have a compatible style that results in an overall consistent aesthetic for the training object 100.

According to one or more embodiments, the object design system trains the machine-learning model based on identifying the plurality of design elements in the plurality of regions. Specifically, the object design system can train the machine-learning model to identify relationships between the design elements. For example, the object design system identifies the relationships between the design elements in a given object to allow the machine-learning model to provide recommendations to a user based on the learned relationships. Additionally, the object design system identifies position, size and/or other characteristics of the design elements or of instances of the design elements within each region when training the machine-learning model.

As briefly discussed above, the object design system trains the sequence-based machine-learning model such that the overall design of a region (e.g., the style of the design element in combination with design characteristics such as size, density and composition) depend on the overall design of an adjacent region. For example, for the object 100 of FIG. 1, the object design system trains the sequenced-based model by determining a relationship between the style and characteristics of the first design element 108 in the first region 102 and the style and characteristics of the second design element in the second region 104. Due to the sequence-based model, the first region 102 is not directly related to the third region because the first region 102 is not adjacent to the third region 106. The second region 104, however, is directly related to both the first region 102 and the third region 106 because the second region 104 is adjacent to the first region 102 and the third region 106. As such, the first region 102 is indirectly related to the third region 106 through the first region's 102 relationship with the second region 104.

Figure 2:
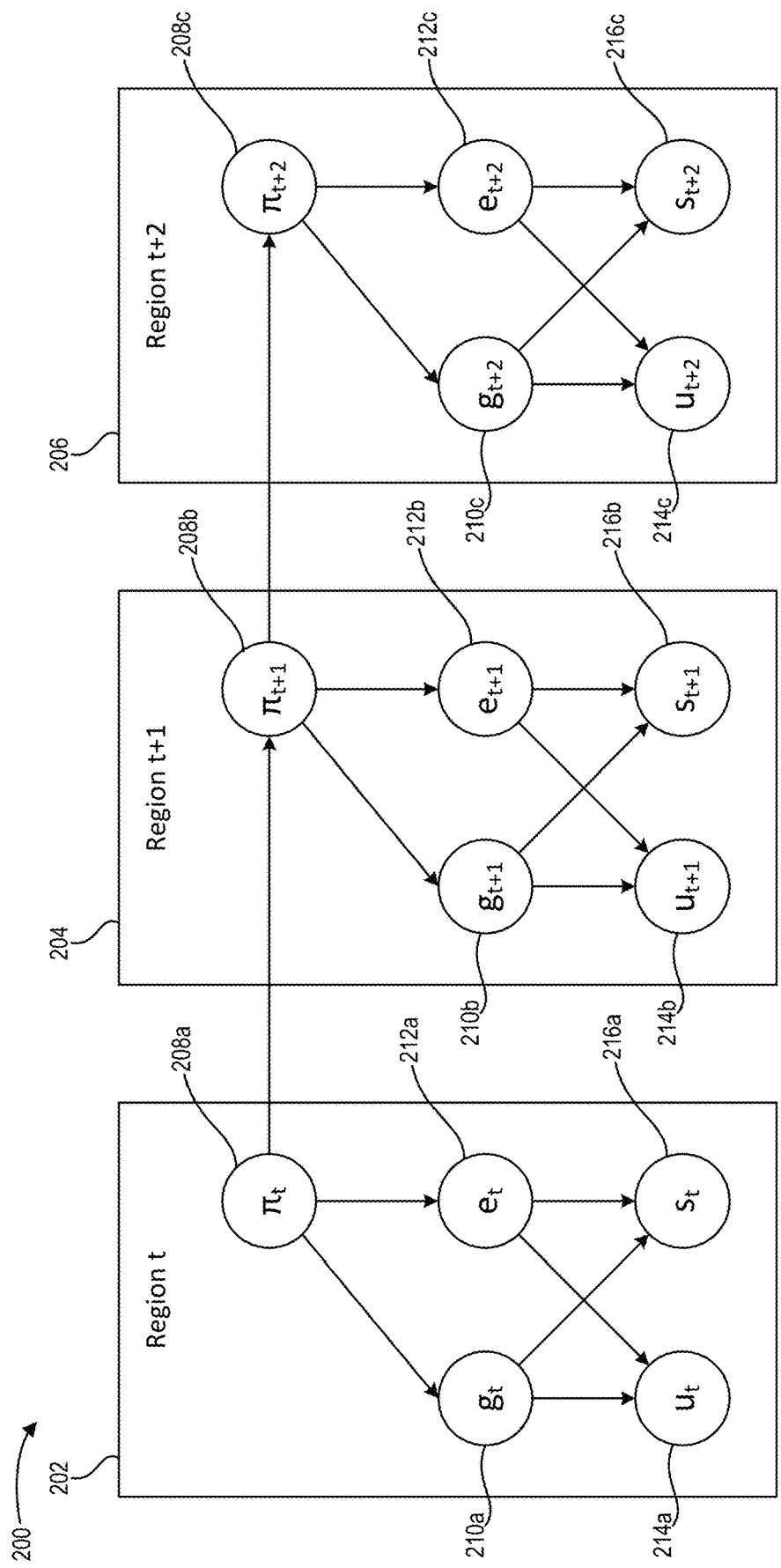
FIG. 2 illustrates a schematic diagram of a machine-learning model in accordance with one or more embodiments.

In one or more embodiments, the machine-learning model is a hidden Markov model (HMM). FIG. 2 illustrates an embodiment of an HMM 200 for use with the object design system of FIG. 1. In particular, the HMM 200 includes a plurality of states that define one or more design characteristics of a plurality of regions of an object. For example, each state corresponds to a single region and the corresponding design characteristic(s) within the region. To illustrate, for the training object 100 of FIG. 1, the HMM 200 includes a first state 202 for the first region 102, a second state 204 for the second region 104, and a third state 206 for the third region 106. For an object including more or fewer regions than shown in FIG. 1, the HMM 200 would include more or fewer states, as may pertain to a particular embodiment or a particular example object.

As illustrated, each state in the HMM 200 includes a plurality of values associated with the corresponding region. For example, and as shown in FIG. 2, each state includes a state value 208a ($\pi_t$), 208b ($\pi_{t+1}$), 208c ($\pi_{t+2}$); a style value 210a ($g_t$), 210b ($g_{t-1}$), 210c ($g_{t+2}$); a size value 212a ($e_t$), 212b ($e_{t+1}$), 212c ($e_{t+2}$); a density value 214a ($u_t$), 214b ($u_{t+1}$), 214c ($u_{t+2}$); and an arrangement value 216a ($s_t$), 216b ($s_{t+1}$), 216c ($s_{t+2}$). Each state may include other values, such as one or more values representing one or more characteristics of the corresponding region including, but not limited to, a region size value, a region location value, and a region shape value, as may serve a particular embodiment.

Generally, and as previously discussed above, in a sequence-based machine-learning model such as the MEW 200 shown in FIG. 2, state values in one state relate to state values in adjacent states. For example, the MEW 200 can determine how the state value 208*a* in the first state 202 is related to the state value 208*b* in the second state 204 based on a comparison of the state values associated with the first state 202 and the second state 204. As described above, because a state value of a particular region represents the overall design within the particular region, how the state value of a first region (e.g., the first state 202) compares with the state value of the second region (e.g., the second state 204) captures a relationship between the overall design of the first region compared to the overall design of the second region.

To illustrate, the object design system can use the HMM 200 to compare how the first state 202 to the second state 204 to identify how the corresponding style values, size values, density values, and arrangement values for the first state 202 compares to the corresponding style values, size values, density values, and arrangement values for the second state 204. Accordingly, the object design system can determine a relationship between the state value 208*a* and the state value 208*b* are related. Similarly, the HMM 200 can identify how the state value 208*b* in the second state 204 relates to the state value 208*a* in the first state 202 and the state value 208*c* in the third state 206. Likewise, the HMM 200 can identify how the state value 208*c* in the third state 206 relates to the state value 208*b* in the second state 204.

The object design system uses the unique nature of the HMM 200 of recognizing relationships between different states to train a model to recognize relationships between the different regions of training objects. In other words, using a set of training objects, the HMM 200 can determine a state value 208 for each region of a single training object by identifying a style value 210, a size value 212, a density value 214, and an arrangement value 216 for the design element(s) within each region of the training object. Based on the state values 208 that the HMM 200 determines for each region, the HMM identifies relationships between each of the state values 208, which in turn represents a relationship between each of the regions of the training object. Accordingly, as the HMM is trained, the HMM identifies the relationship of the overall design aesthetic of a first region of an object to the overall design aesthetic of a second region. Therefore, and as will be explained in detail below, upon a user providing one or more inputs that at least partially define a region of an object, the HMM can generate a design for another region of the object based on the identified relationships between state values that were learned during training of the HMM.

The object design system repeats the above process for a set of training objects, which allows the HMM 200 to further define relationships between the state values 208 based on as many training objects as a user decides to use as a training set of objects. In one or more embodiments, the object design system trains the HMM 200 on a set of training objects including varying numbers of regions. For example, some training objects in the set of training objects include a first number of regions while other training objects in the set of training objects include a second number of regions, etc. Alternatively, one or more embodiments of the object design system train the HMM 200 on a set of training objects including the same number of regions. To illustrate, the training objects in the set of training objects all have the same number of regions for training an HMM 200 to have a specific number of trained states.

Specifically, the state value can include a numerical value that the object design system generates based on one or more characteristics of the design element or region. To illustrate, the object design system may generate a state value for a given region based on style value(s) 210 of the corresponding design element(s) within a region. The object design system can determine a style value 210 for a design element using a variety of techniques, as will be discussed in addition detail below with respect to FIGS. 5 and 6.

In one or more embodiments, the size value 212 represents a size of the design element in a region. In one example, the object design system can determine a size value 212 of a design element relative to a size of the region. For example, if the training object is a plate, the object design system can determine a size value 212 based on the relative size of the design element to the ring size of the region (e.g., an area of the ring, or a distance between an outer diameter or an inner diameter of the ring). Alternatively, the object design system determines a size value 212 of a design element using a predetermined scale corresponding to the actual size of the design element. In another example, the object design system uses a relational scale that determines a size value 212 of a design element relative to other design elements. Furthermore, determining a size value 212 for a design element can include identifying the fraction of a total area of a region a single instance of the design element occupies.

As further shown in FIG. 2, a state value 208 can also be based on a density value 214. According to one or more embodiments, the density value 214 represents a number and/or spacing of instances of a design element in a region. For example, a higher density value 214 represents a greater number of instances of the design element that are closer together, such as a dense pattern with numerous instances of the design element. Conversely, a lower density value 214 represents a lower number of instances of the design element that are farther apart, such as a sparse pattern with only a few instances of the design element. The density value 214 can be represented as an angular value or radial value for circular regions. In addition, the density value 214 can indicate that the density is scalar or continuous, as will be explained in addition detail below in FIGS. 4A-4B.

As FIG. 2 also shows, and as briefly discussed above, a state value 208 can also least partially based on an arrangement value 216. Generally, the arrangement value 216 represents an arrangement of one or more instances of a design element in a region. Specifically, the arrangement value 216 represents a position and orientation of one or more instances of the design element in the region. For example, the arrangement value 216 can specify that the arrangement of a design element within a region is rotational, translational, procedural filled, or fixed, as will be discussed in additional detail with respect to FIGS. 3A-3D below.

In one or more additional implementations, a state value 208 can be based on additional characteristics or features of a training object. For example, a state value 208 can be based on one or more values that define one or more characteristics of a region of a training object. For example, a state value 208 can depend on the overall area of a region, the width/length of region, the position of a region within a plurality of regions (e.g., whether the region is surrounded by other regions on all sides, or whether the region is on the end of an object). In addition, region characteristics can include a size (e.g., area) of a region compared to the overall size of an object, or a size of a region compared to one or more adjacent regions. Additionally, the general shape of a region can affect a state value 108, for example, an annular region may have a different region value compared to a rectangular region.

Figure 3A:
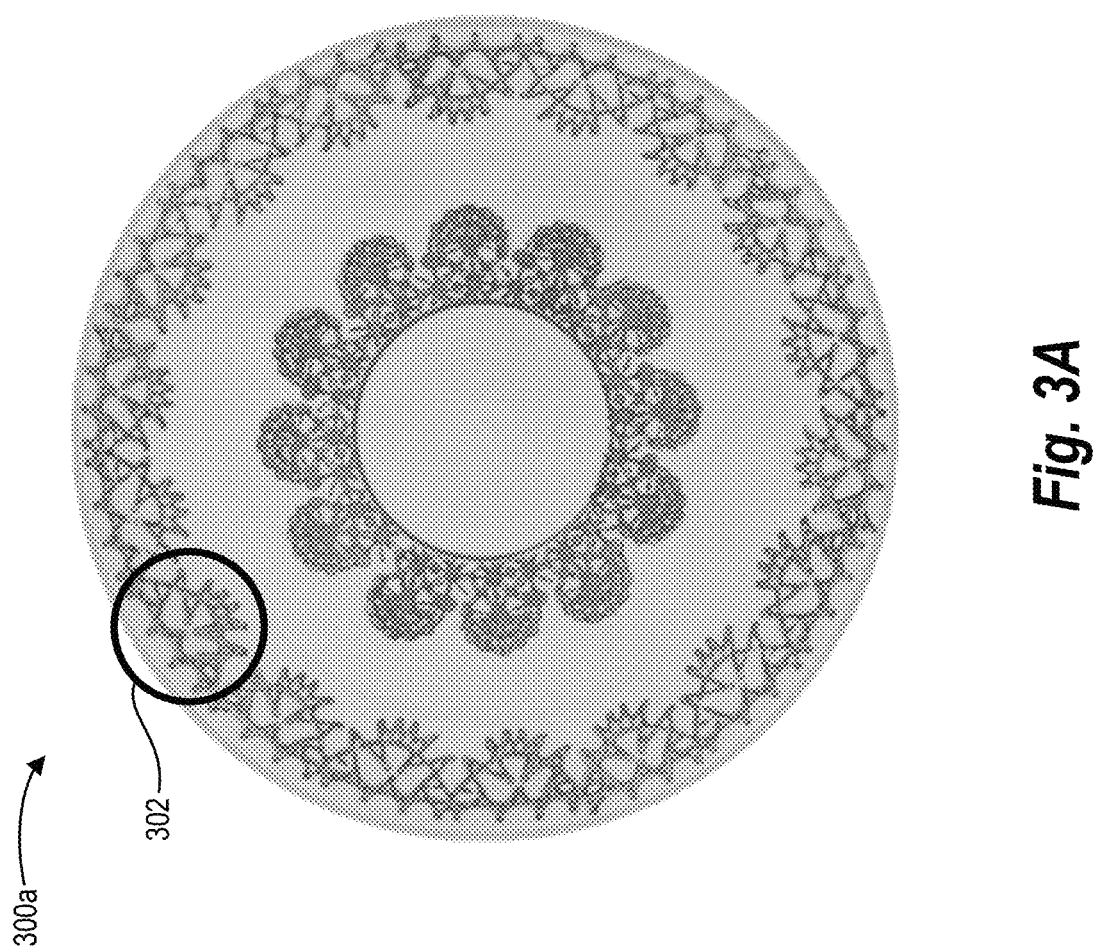

As mentioned above, one or more embodiments of an object design system can identify an arrangement of a design element within a region of a training object. FIGS. 3A-3D illustrate various arrangement types that the object design system can identify. For example, FIG. 3A illustrates an example of an object (e.g., a plate) with a design element having a rotational arrangement. In particular, FIG. 3A illustrates a region of the object 300*a* containing a design element 302 with a rotational arrangement value (i.e., an outer ring of the plate). The rotational arrangement value indicates that a plurality of instances of the design element 302 is rotated around the center of the object 300*a* so that the same portion of the design element 302 faces the center of the object 300*a* through the entire region. Alternatively, the rotational arrangement value may indicate that the design element follows a path around a fixed point of the object 300*a*, as may be the case for non-circular objects. Thus, the object design system can determine that a design element in a region of a training object has a rotational arrangement by detecting that the design element appears to rotate or follow a path around a fixed point.

FIG. 3B illustrates an example of an object 300*b* with a design element having a translational arrangement. Specifically, a translational arrangement value indicates that instances of a design element are translated to specific locations within the region and repeated at a specific interval. Additionally, the translational arrangement value can indicate that instances 304*a*, 304*b* of the design element are translated to more than one specific location within the region (e.g., relative to the boundaries of the region) and repeated at a specific interval for each specific location.

For example, FIG. 3B illustrates a plurality of instances 304*a* of a design element translated to a plurality of repeating positions around an outer portion of a circular region. Additionally, FIG. 3B illustrates a plurality of instances 304*b* of the same design element translated to a plurality of repeating positions around an inner portion of the same circular region. Accordingly, the translational arrangement value can include a value that indicates a number of different translation positions for the design element. Alternatively, for purposes of training the HMM, the translational arrangement value may simply indicate that the design element is arranged in a translational pattern.

Figure 3C:
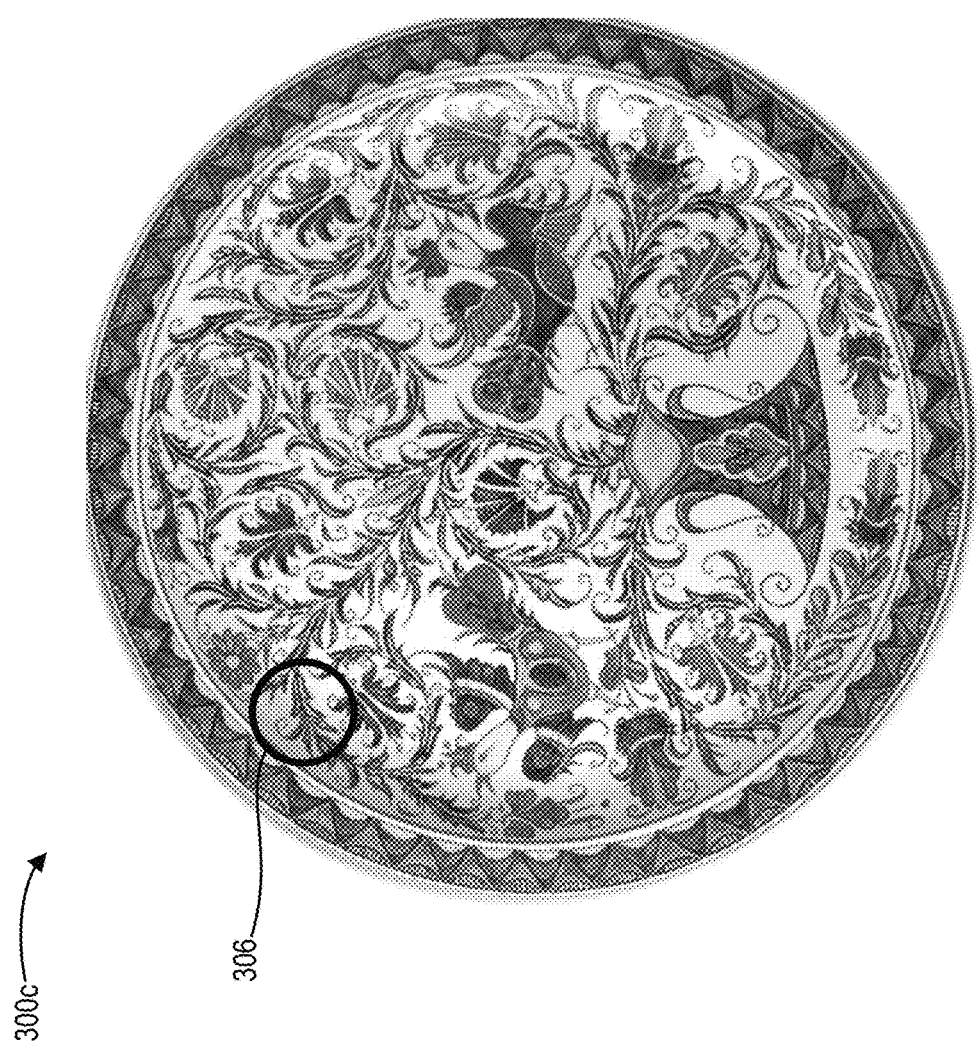

In one or more embodiments, a design element (or a plurality of instances of the design element) is used as a procedural fill to populate at least a portion of a region. For example, FIG. 3C illustrates an example of an object 300*c* with a design element 306 having a procedural fill for a region. Specifically, the design element 306 includes a tree-like design element that follows no strict pattern or structure within the region. A procedural fill value indicates that the particular design element 306 (e.g., the tree-like design element) may include small components that fill a specific area or percentage of the region and that the object design system may model using an underlying algorithm that includes one or more rules for repeating the small component(s).

Figure 3D:

FIG. 3D illustrates an example of an object 300*d* with a design element 308 having a fixed arrangement value. In particular, a design element may have a fixed arrangement value that indicates an instance of the design element 308 is located in a single, fixed position within the region. For example, the design element 308 can be a unique design element of which a single instance is positioned in the region. To illustrate, FIG. 3D includes a decorative bird design element positioned at a single, fixed location in the region of the object. The fixed position of a design element can virtually be located at any position on an object. Although not shown in FIG. 3D, many circular objects include a design element having a fixed arrangement located in the center of the circular object (e.g., in the center of a plate).

Figure 4A:
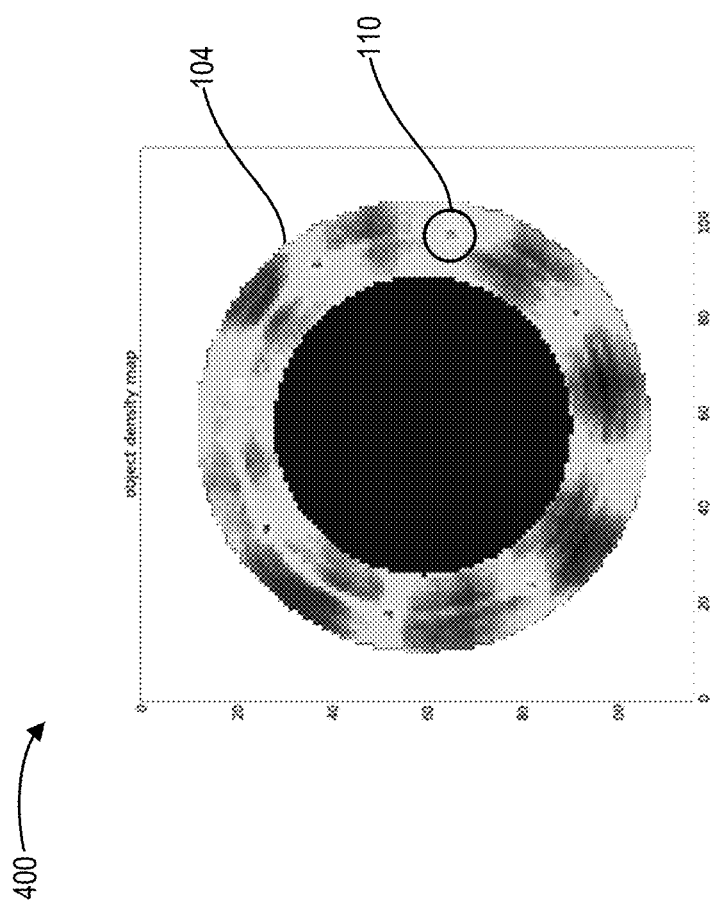
FIGS. 4A-4B illustrate image analysis and statistical representations of characteristics of a design element in accordance with one or more embodiments.
Figure 4B:
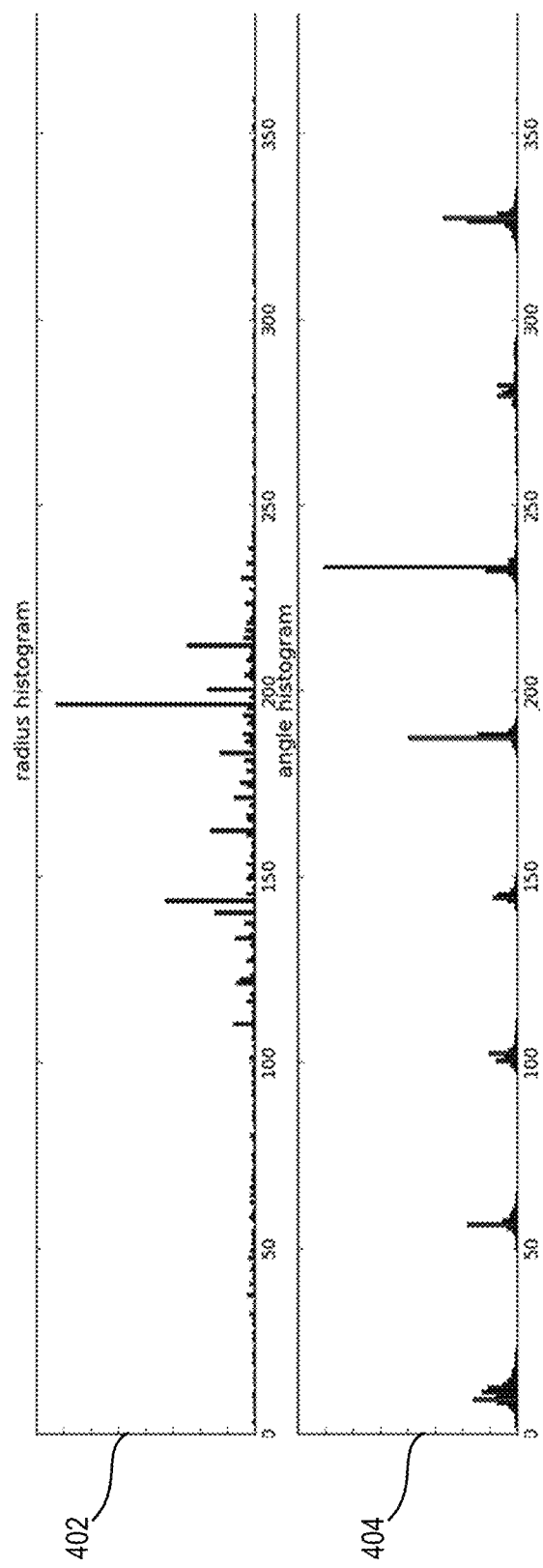

As previously mentioned, the composition of a design element also includes a density value for a design element in a particular region. FIGS. 4A-4B illustrate various graphs representing statistical data associated with a plurality of sample design elements. Specifically, the object design system can calculate the density of objects in a region when calculating one or more composition values, such as the density value, for design elements in a region of an object.

To illustrate, FIG. 4A illustrates an object density map 400 for the second region 104 of the object 100 of FIG. 1. As shown in FIG. 4A, the object design system determines whether a specific design element in the region is scalar or continuous based on an object density map 400. For example, the object design system generates the object density map 400 (e.g., a heat map) using image processing to identify patterns within the region. Although FIG. 4A illustrates an object density map based on oriented gradients, the object design system can use any type of image processing techniques to determine the density (or frequency) and positioning of the design elements in an object.

In one or more embodiments, the object design system can compute the object density map 400 based on a histogram of oriented gradients, which counts occurrences of gradient orientation in localized portions of an image. For example, using a histogram of oriented gradients, the object design system determines where each design element is located in the region, and how dense each design element is. In particular, the object design system uses a radius histogram and an angle histogram to compute a density value of a design element for a region.

To illustrate, FIG. 4B shows a radius histogram 402 and an angle histogram 404 that corresponds the second region 104 of the training object 100 of FIG. 1. As illustrated in the angle histogram 402, the object design system determines that the design element 110 in the second region 104 are positioned approximately every 40-50 degrees around the center of the object. As illustrated in the radius histogram 404, the design elements 110 are most dense in the middle of the region 104, and taper off to be less dense toward the edges of the region 104 (i.e., the design elements are somewhat circular in nature).

Because the second region 104 of the training object 100 of FIG. 1 contains empty space, the object design system can recognize both the empty space and the space containing design elements and generate the object density map 400 accordingly, and in turn, the object design system can determine that the density of the design element is scalar. If the object design system identifies a region that does not contain empty space, the object design system can generate the object density map 400 and determine that the density of the design element is continuous. For instance, the object design system would be able to determine that the first region 102 and the third region 106 of the training object 100 of FIG. 1 include continuous design elements based on the lack of empty space in the object density map 400.

In addition to a density value, and as discussed briefly above, one or more embodiments of the object design system also identifies style characteristics of design elements using image processing and statistical analyses. Specifically, the object design system generates a histogram of each design element representing visual features of the design element. The object design system uses the histogram to calculate a first style value for each design element to identify similar design elements and cluster the design elements into groups of similar design elements. Additionally, the object design system uses the visual features (i.e., feature vectors) of the design element to calculate a second style value.

Figure 5:
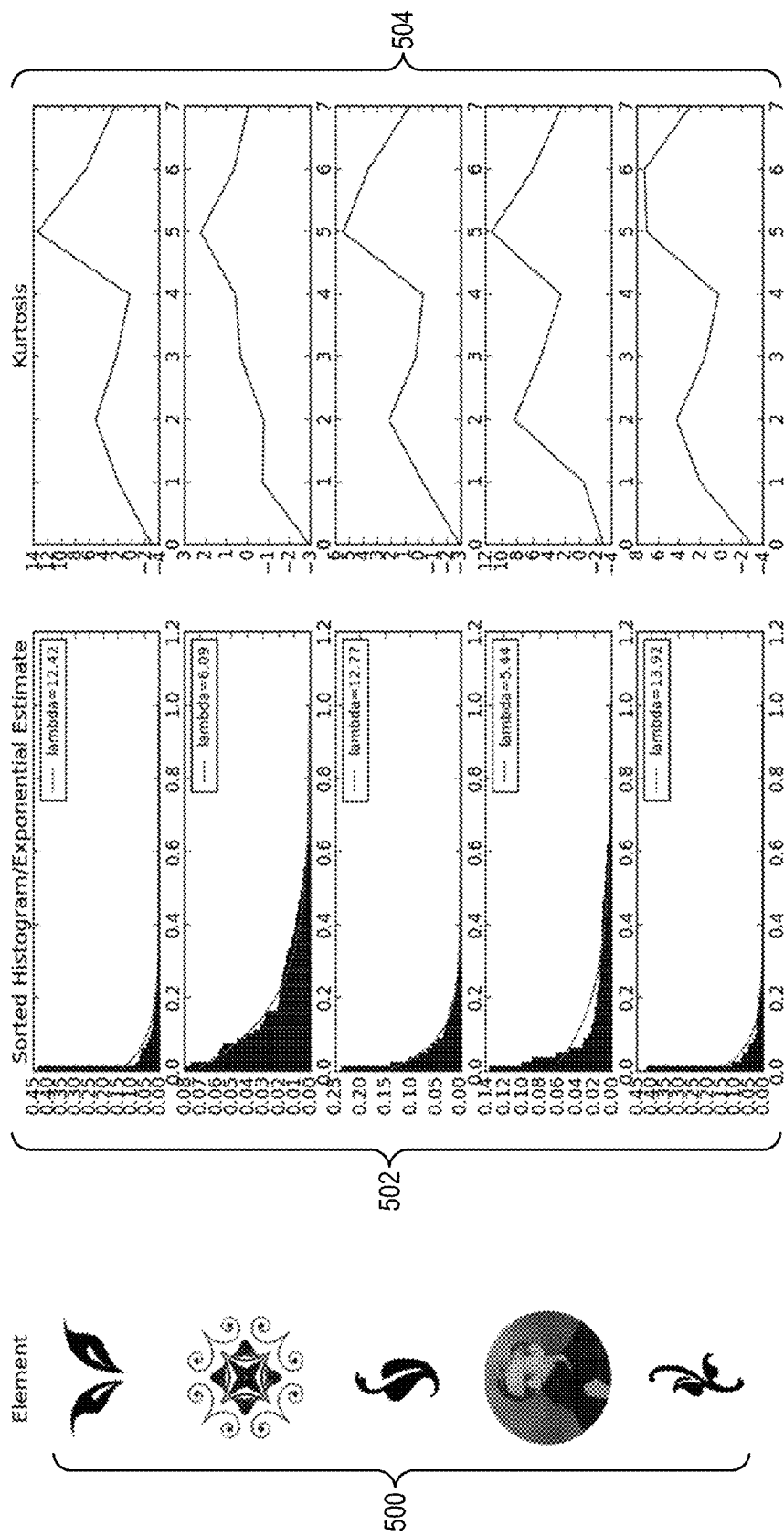
FIG. 5 illustrates statistical representations of style characteristics of a plurality of design elements in accordance with one or more embodiments.

FIG. 5 illustrates a plurality of design elements 500, histograms 502 for the plurality of design elements 500, and a plurality of graphs 504 representing kurtosis values for each of the design elements 500. As mentioned, the object design system generates two values to represent the style of a design element. In particular, the object design system first generates a histogram 502 representing the features of the design element based on the pixels of the design element. In one or more embodiments, the object design system classifies the pixels of a design element using a texture descriptor such as the Maximum Response 8 (MR-8) descriptor, which classifies pixels into different bins based on an appearance of the pixels. The object design system then uses the pixel classification to generate the histogram 502 for the design element.

After generating the histogram 502, the object design system calculates a first value (i.e., a "lambda value") that represents a curve of the histogram. Specifically, the lambda value indicates the shape of the histogram 502 by assigning a value based on the exponential distribution of the histogram curve. For example, and as shown in FIG. 5, when a design element is a simple design element, the curve of the corresponding histogram is sharper, resulting in a higher lambda value. However, when the design element is a more complex design element, the curve of the corresponding histogram is more gradual, resulting in a lower lambda value. As illustrated in FIG. 5, the lambda value based on the curve of the histograms 502 is similar for design elements that are visually similar (e.g., the design element having a lambda value of 12.42, is visually similar to the design element having a lambda value of 12.77).

In one or more embodiments, the object design system also calculates a second value (i.e., a "kurtosis value" or "kappa value") for each design element, represented in the plurality of kurtosis graphs 504. The kurtosis value represents a distribution noise associated with a plurality of feature vectors based on the MR-8 descriptor for each design element. Specifically, the kurtosis value characterizes the "tailedness" of the distribution from the plurality of feature vectors. The object design system uses the maximum kurtosis value for each of the design elements 500 as the kappa value. The object design system then assigns the lambda value and the kappa value for each design element as a style value pair of each design element 500 (e.g., each design element is associate with a number pair [$\lambda$, $\kappa$].

Once the object design system has obtained a style value pair associated with a particular design element, the object design system determines how similar the style of the particular design element is to another design element. Specifically, the object design system uses both the lambda value and the kappa value to compare a first design element to a second design element. For example, if the lambda value and the kappa value of the first design element are respectively similar to the lambda value and the kappa value of the second design element, the object design system may determine that the styles of the first design element and the second design element are similar. If either the lambda value or the kappa value for the first design element is not similar to the corresponding value of the second design element, the object design system may determine that the styles of the first design element and the second design element are not similar.

In one or more embodiments, the object design system determines that design elements are similar based on differences in the calculated lambda and kappa values. For example, the object design system can calculate a difference between the values and compare the difference to one or more threshold values. Additionally, the object design system may use dynamic clusters that may change based on new design elements learned by the HMM. For instance, if the object design system learns a new design element, the object design system can adjust one or more threshold values and regroup the plurality of design elements into clusters based on the new threshold values. Additionally, a user can adjust the threshold value to control how similar recommended design elements are to a user-selected design element. For instance, a user can set a threshold value such that the object design system is able to recommend a wide range of styles, or alternatively, a user can set a threshold value such that the object design system recommends only a narrow range of styles.

To illustrate, the object design system can identify the lambda value and the kappa value for a first design element in a first region. Using a covariance matrix for identifying a Gaussian emission of the region, the object design system can determine the shape of the Gaussian distribution associated with the state value of the first region. Based on the shape of the Gaussian distribution, the object design system then identifies other design elements having lambda/kappa values corresponding with the Gaussian distribution. For instance, if the object design system determines that the shape of the Gaussian distribution of the first design element is spread out, the styles of design elements that the object design system may select is varied. Alternatively, if the shape of the Gaussian distribution of the first design element is narrow, the styles of design elements that the object design system may select is more limited.

In one or more alternative embodiments, the object design system groups a plurality of design elements from a database into clusters based on the similarities of the styles of the design elements. FIG. 6 illustrates a plurality of clusters 600 of design elements from a database. By grouping the design elements, the object design system provides recommendations of similar design elements quickly and accurately so that a user can design an aesthetically consistent object. For example, if a user selects a design element from a first cluster 602, the object design system recommends a design element from the same cluster 602, depending on one various other factors as described above.

As mentioned previously, the object design system trains the HMM to recognize similarities between design elements and state (or region) characteristics. Due to the ability of a trained HMM to identify relationships between design elements and characteristics of patterns within multiple regions of an object, a trained HMM is able to provide recommendations to a user in designing a new object. Specifically, although the state values are hidden in an HMM, the trained HMM can analyze an object to be designed and one or more user-selected design elements to determine various design elements and designs characteristics to recommend to the user to populate the remaining regions of the new object.

Additionally, because a trained HMM is sequence-based, the object design system provides recommendations to a user for any region adjacent to a populated region. To illustrate, when a user selects a design element (whether from the database or custom designed by the user) for populating a region, the object design system can identify the features of the selected design element and provide a recommendation how the region should be populated with the design element (e.g., the size, density, and arrangement of the design element within the region). In addition, the object design system can further recommend a design element from a cluster of design elements to use in an adjacent region.

More specifically, when a user selects a design element to populate a first region of an object, the object design system calculates a state value for the first region based at least in part on the style value(s) of the design element. The object design system calculates one or more state values for one or more adjacent regions based on the state value for the first region and using relationships learned from during the training process of the HMM. The object design system then identifies style value(s) for providing a recommendation of a design element in each of the one or more adjacent regions based on the calculated state value for the corresponding adjacent region. The object design system can then identify a cluster containing design elements with similar style values and select a design element from the identified cluster to recommend to the user.

In one or more embodiments, the object design system generates a state value for a region adjacent to the first region by modifying the first state value. In one example, the object design system generates a second state value for the second region by modifying the first state value by a random value within a threshold of the first state value. To illustrate, the object design system may generate the second state value by incrementing or decrementing the first state value by a random value constrained to be within a specific value distance from the first state value. In an alternative example, the object design system generates a second state value for the second region by modifying the first state value by a predetermined value. To illustrate, the object design system may generate the second state value by incrementing or decrementing the first state value by a predetermined amount to obtain a state value that is similar to the first state value and results in recommending a design element that is similar to, but different than, the first design element. In yet another example, the object design system generates the second state value based on a position and a size of the second region relative to the position and the size of the first region.

The object design system may also provide recommendations of new design elements that are not in the database. In one or more embodiments, after identifying the style values of the user-selected design element (or after identifying the corresponding cluster if using cluster-based selection), the object design system generates a new design element based on the style values. For example, the object design system automatically generates a new design element using an element design algorithm that takes the style values as an input. Alternatively, the object design system can modify an existing design element in a cluster of design elements to create a new design element that has similar style values.

After selecting a design element for recommending to a user, the object design system can populate the region automatically or in response to a request by the user to populate the region with the recommended design element. In one or more embodiments, the object design system also provides a recommended density, size, and/or arrangement (or other characteristic, such as color) of the recommended design element based on the characteristics of the user-selected design element. To illustrate, the object design system may recommend that the design element be continuous within the region and have a rotational arrangement. Alternatively, the object design system may receive a user input to select or modify the density, size, and/or arrangement of the design element within the region.

In one or more embodiments, the object design system determines a design element based on more than one user-selected design elements. Specifically, the object design system may allow a user to select design elements for more than one region in an object and receive recommendations for design elements in one or more remaining regions. For example, if the user selects design elements for an inner region and an outer region of a circular object, the object design system provides a recommended design element for an intermediate region between the inner region and the outer region based on the user-selected design elements in both the inner region and the outer region. To illustrate, the object design system calculates a state value for the intermediate region based on the state values of the other two regions, and determines style values for the recommended design element from the calculated state value. The object design system can then recommend a design element with the style values based on both user-selected design elements.

In one or more embodiments, the object design system allows regions to overlap partially or wholly. For example, if a first region overlaps with a second region, the object design system can populate the first region and the second region with a first design element and a second design element, respectively. The resulting regions may appear to include more than a single design element in a single region, though the first region and the second region are actually different regions. Alternatively, the object design system can allow a user to input a plurality of design elements into a single region.

Figure 7A:
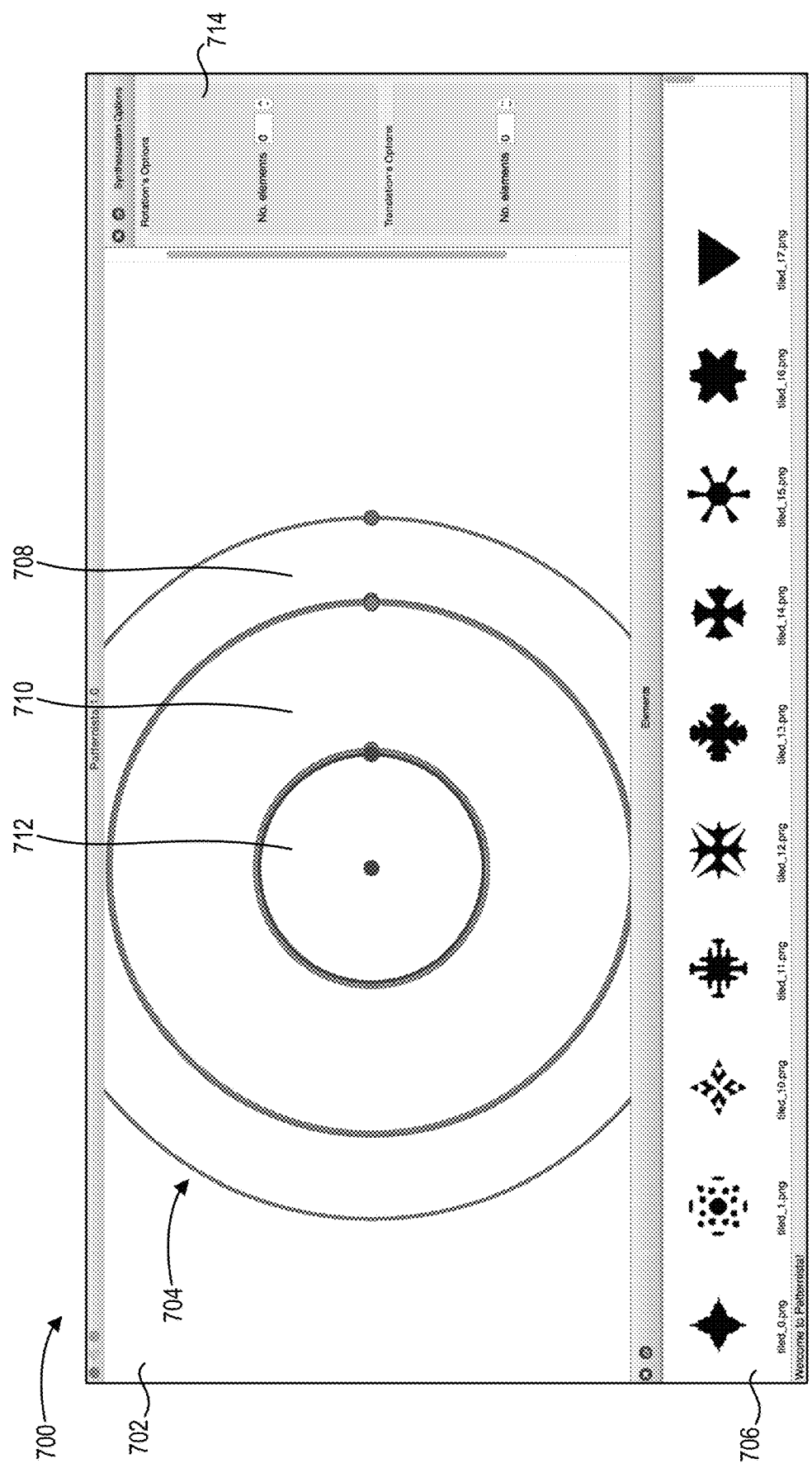
FIGS. 7A-7B illustrate graphical user interfaces for designing an object in accordance with one or more embodiments.
Figure 7B:
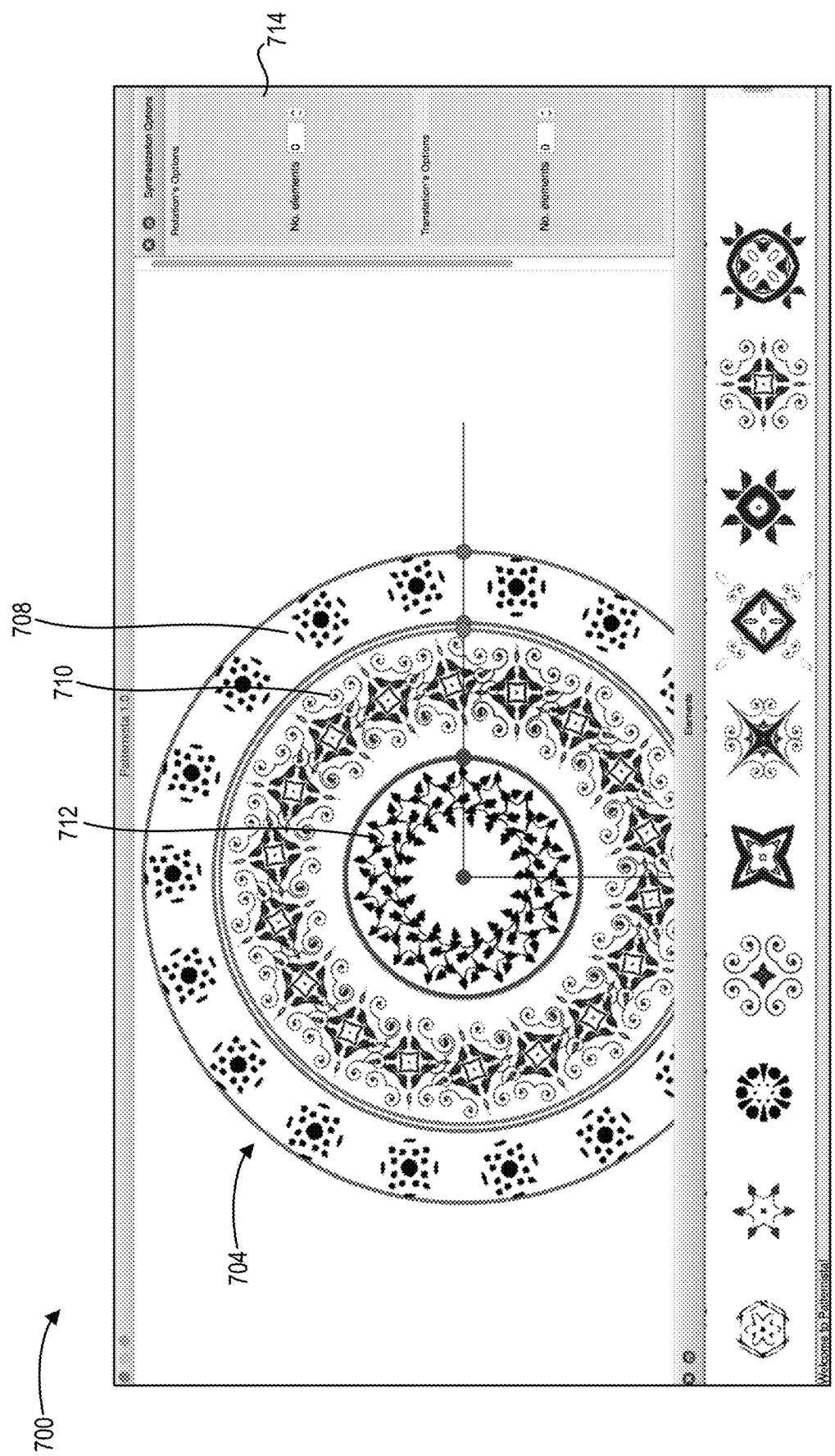

FIGS. 7A-7B illustrate embodiments of a graphical user interface 700 for designing an object with the object design system. In particular, the user interface 700 allows a user to design an object that has a plurality of empty regions (i.e., regions that do not include any design elements). FIG. 7A illustrates a design window 702 that displays a design template 704 for an object with a plurality of regions 708, 710, 712. As described previously, the object may be a turntable object such as a plate, bowl, cup or vase. The regions may correspond to separate physical regions of a specific object or may be manually-defined logical regions.

In one or more embodiments, the user interface 700 includes an element palette 706 that includes a plurality of design elements available to a user. Specifically, the element palette 706 includes design elements stored in a database of design elements that the user may select to populate one or more regions. For example, the element palette 706 includes a plurality of design elements that the object design system has previously identified from the training objects. In another example, the element palette 706 includes one or more design elements that the user or the object design system has generated.

The element palette 706 can display the plurality of design elements according to a variety of display preferences. For example, the element palette 706 may display the design elements alphabetically by filename or design name, according to the cluster to which the design elements belong, or according to whether the design elements are user-generated design elements or based on training objects. In one or more embodiments, the user interface 700 allows the user to change the display method of the element palette 706, such as by way of a dropdown box.

The user interface 700 may allow the user to select any design element from the element palette 706 for populating any of the visible regions 708, 710, 712. For example, the user interface 700 allows the user to select a design element from the element palette for a first region 708. The user may select a design element for the first region 708 by selecting a design element and dragging the design element from the element palette 706 to the region 708 in the design window 702 (e.g., a drag-and-drop action using a mouse cursor or a touch gesture on a touch screen). Alternatively, the user may select the design element for the first region 708 using another method, such as by right-clicking the element and selecting the region 708 from a dropdown menu that automatically detects the regions in the design window 702.

FIG. 7B illustrates an embodiment of the user interface 700 with all regions of the design template populated with different design elements. Specifically, the design window 702 includes one region with the user-selected design element and the remaining regions with design elements that the object design system selected based on the user-selected design element. For example, when the user drops the selected design element into the first region 708, the object design system populates the first region 708 with the selected design element. In one or more implementations, upon selecting the design element for the first region 708, the object design system determines composition characteristics (e.g., size, density, and arrangement) for the user-selected design element and populates the region 708 according to the selected composition characteristics based on the trained HMM model. Alternatively, the object design system can receive a user input indicating one or more of the selected composition characteristics for populating the region 708 using one or more synthesizing options 714 in the user interface 700.

In one or more embodiments, after the user selects a design element, the object design system identifies design elements for the second region 710 and the third region 712. For example, using the learned relationships between the state values for each region from the trained HMM model, the object design system determines a second design element for the second region 710 and a third design element for the third region 712 based solely on the user selecting a design element for the first region 708. Moreover, the learned relationships between the state values for each region from the trained HMM model allow the object design system to determine the size, density, and/or arrangement of the design elements for populating the second region 710 and the third region 712.

The specific design characteristics the object design system determines can vary from one embodiment to the next, or can be based on user settings. For example, a user may want to control the size of a design element within a particular region, but may want the object design system to recommend the arrangement, density, and/or design element style. In this way, a user is allowed to customize and make design decisions as the user desires, while also receiving recommendations for other design decisions from the object design system.

The user interface 700 may also allow the user to perform other operations or customization associated with designing an object. For example, the user interface 700 may allow the user to save design templates for use in other design projects and modify previously saved templates. Additionally, the user interface 700 may allow the user to select a color of one or more of the design elements, adjust one or more of the regions (e.g., size or location), modify a recommended design element, swap design elements of two or more regions, create new design elements, or create new regions.

In one or more embodiments, each time a user updates a design (e.g., changes a design element, defines a density, size or arrangement within a region, etc.), the object design system updates the state value of the region based on the updated design. Furthermore, using the updated state value, the object design system uses the learned relationships between the state values to update the other regions of the object. For example, based on a user changing a design element in one region, the object design system can change one or more of the design element, size, density, and/or arrangement in one or more other regions of the object based on the relationship between the states of each region. In this way, the object design system can push a design update throughout all regions of the object and maintain an overall design aesthetic. If a design change is minor, however, the object design system may determine that no other changes are needed.

The user interface 700 also allows a user to set preferences associated with design elements. In one or more embodiments, the user interface 700 includes a preferences menu or preferences options 714 that allow a user to select certain design elements that the user prefers to user or prefers not to use in designs. For example, if the user identifies one or more elements as preferred elements, the object design system recommends the preferred elements more frequently than non-preferred elements. Similarly, the object design system may not recommend design elements that the user has indicated that the object design system should not recommend. The user preferences may include other options, such as cluster rankings, or style preferences (e.g., based on the clusters or based on specific artists or time periods).

Figure 8:
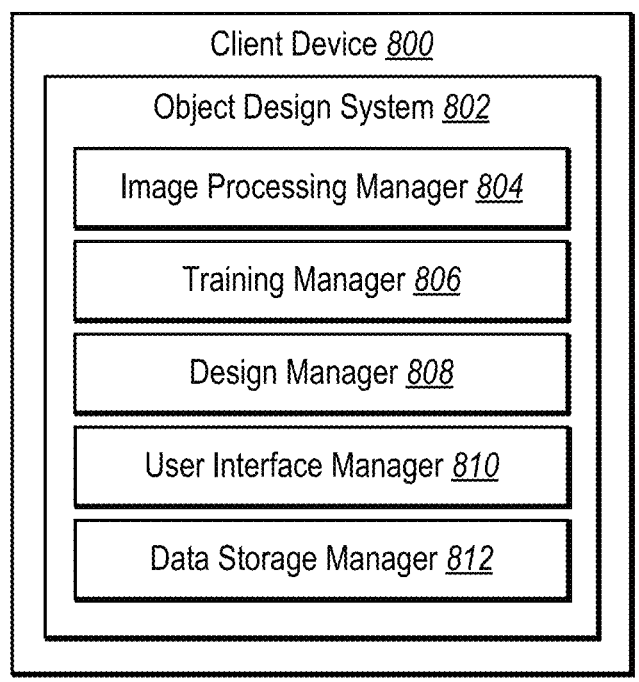
FIG. 8 illustrates a schematic diagram of a client device including an object design system in accordance with one or more embodiments.

As described above, an object design system can aid a user in designing an object to have a specific or consistent design aesthetic. FIG. 8 illustrates a schematic diagram of a client device 800 including an object design system 802 for performing the object design methods described herein. The object design system 802 can include, but is not limited to, an image processing manager 804, a training manager 806, a design manager 808, a user interface manager 810, and a data storage manager 812. Although the object design system 802 of FIG. 8 is depicted as having various components, the object design system 802 may have any number of additional or alternative components. For example, the object design system 802 can include components for managing user inputs or for managing output (e.g., to a display device). Additionally, the image processing system may include components for producing physical designs from design templates.

In one or more embodiments, each of the components and subcomponents of the object design system 802 can be in communication with one another using any suitable communication technologies. It will be recognized that although the subcomponents of the object design system 802 are shown to be separate in FIG. 8, any of the subcomponents may be combined into fewer components, such as into a single component, or divided into more components as may serve a particular implementation. Furthermore, although the components of FIG. 8 are described in connection with the object design system 802, at least some of the components for performing operations in conjunction with the object design system 802 described herein may be implemented on other devices.

The components of the object design system 802 can include software, hardware, or both. For example, the components of the object design system 802 (e.g., the image processing manager 804, the training manager 806, the design manager 808, the user interface manager 810, and the data storage manager 812) can include one or more instructions stored on a computer-readable storage medium and executable by processors of one or more computing devices such as the client device. When executed by the one or more processors, the computer-executable instructions of the object design system 802 can cause the computing device(s) to perform the depth correction processes described herein. Alternatively, the components of the object design system 802 can comprise hardware, such as a special purpose processing device to perform a certain function or group of functions. Additionally or alternatively, the components of the object design system 802 can comprise a combination of computer-executable instructions and hardware.

Furthermore, the components of the object design system 802 performing the functions described herein with respect to the object design system 802 may, for example, be implemented as part of a stand-alone application, as a module of an application, as a plug-in for applications including image processing applications, as a library function or functions that may be called by other applications, and/or as a cloud-computing model. Thus, the components of the object design system 802 may be implemented as part of a stand-alone application on a personal computing device or a mobile device. Alternatively or additionally, the components of the object design system 802 may be implemented in any application that allows delivery of content to users, including, but not limited to, applications in ADOBE CREATIVE CLOUD, such as ADOBE PHOTOSHOP. "ADOBE", "CREATIVE CLOUD", and "PHOTOSHOP" are registered trademarks of Adobe Systems Incorporated in the United States and/or other countries.

As previously described, the object design system 802 can include an image processing manager 804. Specifically, the image processing manager 804 facilitates analysis and processing of images containing objects. For example, the image processing manager 804 receives an image of an object containing a plurality of different design elements in a plurality of different regions and analyzes the image to identify characteristics of the objects, including characteristics of the regions and design elements. In one or more embodiments, the image processing system processes images of objects from a set of training images.

In one or more embodiments, the object design system 802 also includes a training manager 806 to train a machine-learning model such as the HMI 200 of FIG. 2. In particular, the training manager 806 trains the machine-learning model to recognize different design element styles and compositions. For example, the training manager 806 trains the machine-learning model to identify and establish correlations between different states (i.e., regions) of an object and the corresponding design elements within the regions. Additionally, the training manager 806 trains the machine-learning model to provide recommendations to a user based on the set of training images, one or more user preferences, and on previous design templates associated with one or more objects.

According to one or more embodiments, the object design system 802 includes a design manager 808 to provide recommendations to a user. Specifically, the design manager 808 uses the trained machine-learning model to provide recommendations to a user of design elements and design characteristics, for example, in response to the user selecting a design element for a region of an object. To illustrate, the design manager 808 identifies characteristics of a user-selected design element for a region to determine one or more design elements to recommend for one or more adjacent regions. The design manager 808 may access the design elements for recommending to a user from a database containing a plurality of design elements. Alternatively, the design manager 808 may create new design elements or modify existing design elements from the database to provide recommendations to the user.

The user interface manager 810 facilitates the display of information associated with the object design process on a display device. Specifically, the user interface manager 810 manages a user interface for an application that allows a user to design an object with a plurality of regions. For example, the user interface manager 810 manages an interactive user interface that displays and receives input associated with objects, design elements, design templates, user preferences, and other information that may aid a user in designing and implementing a design template for a given object.

The object design system 802 also includes a data storage manager 812 to manage data that the other components in the object design system 802 use and/or produce. Specifically, the data storage manager 812 can communicate with the other components in the object design system 802 (i.e., the image processing manager 804, the training manager 806, the design manager 808, and the user interface manager 810) to obtain data that the components have produced for storage and/or use by one or more of the components. To illustrate, the data storage manager 812 can store data that includes, but is not limited to, a training dataset, a plurality of design elements, design templates, and data associated with the machine-learning model. In one or more embodiments, the data storage manager 812 communicates with a machine-learning system on one or more servers or systems to access information associated with the machine-learning model.

In particular, the data storage manager 812 communicates with the image processing manager 804 to obtain image processing data associated with analyses of the input image. The data storage manager 812 also communicates with the training manager 806 to obtain information for training and storing the machine-learning model. The data storage manager 812 can also communicate with the design manager 808 to provide data from the machine-learning model for providing recommendations to a user. Additionally, the data storage manager 812 may communicate with the user interface manager 810 to provide information to display to the user on a display device. The data storage manager 812 can store any or all of the information the various components of the object design system 802 generate for use by any of the other components.

FIGS. 1-8, the corresponding text, and the examples, provide a number of different systems and devices for designing objects. In addition to the foregoing, embodiments can be described in terms of flowcharts comprising acts and steps in a method for accomplishing a particular result. For example, FIGS. 9 and 10 illustrate flowcharts of exemplary methods in accordance with one or more embodiments.

Figure 9:
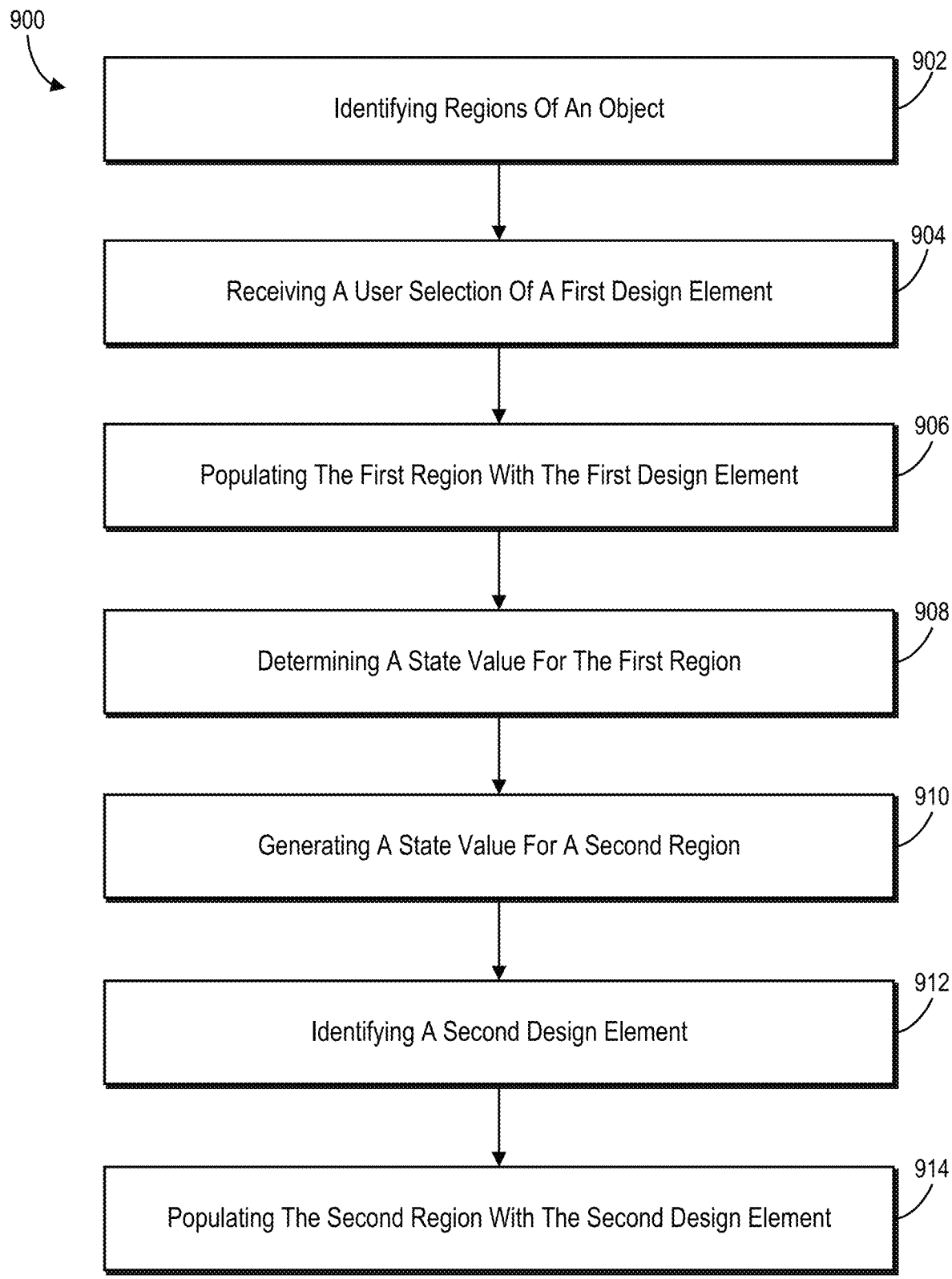
FIG. 9 illustrates a flowchart of a series of acts in a method of selecting an object pattern design in accordance with one or more embodiments.
Figure 10:
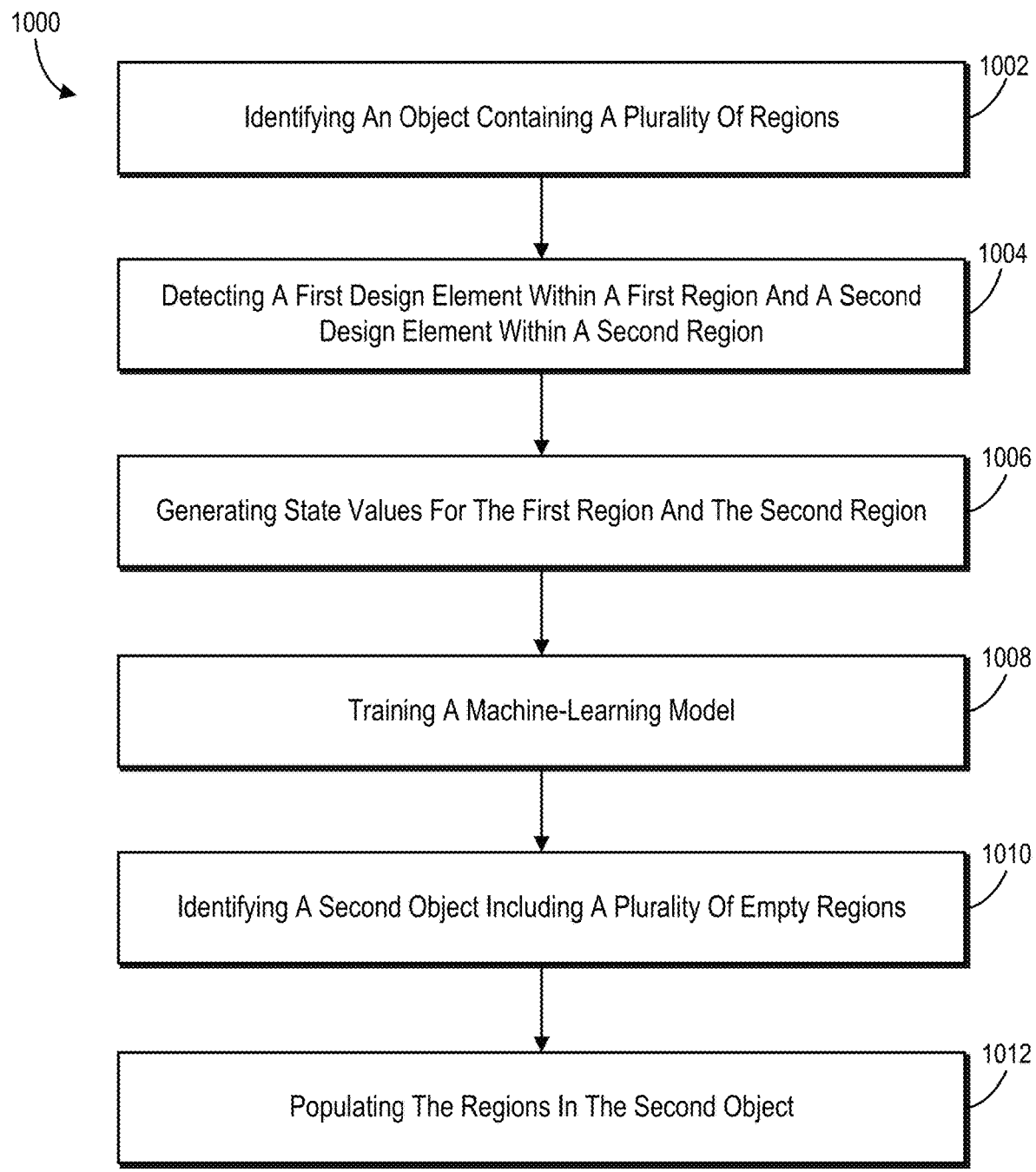
FIG. 10 illustrates a flowchart of a series of acts in another method of selecting an object pattern design in accordance with one or more embodiments.

FIG. 9 illustrates a flowchart of a series of acts 900 in a method of generating an object pattern design. The method 900 includes an act 902 of identifying regions of an object. For example, act 902 involves identifying a plurality of regions of an object, the plurality of regions comprising a first region adjacent a second region. Additionally, act 902 can involve generating a design template associated with the plurality of regions of an object, the design template including a plurality of regions.

The method 900 further includes an act 904 of receiving a user selection of a first design element. For example, act 904 involves receiving a user selection of a first design element from a plurality of design elements. To illustrate, act 904 can involve receiving a user selection of the first design element from an element palette in a user interface, and applying the first design element to the first region. For instance, act 904 can involve receiving a selection of the first region in a user interface in connection with the user selection of the first design element, and associating the first design element with the first region.

Additionally, the method 900 includes an act 906 of populating the first region with the first design element. For example, act 906 involves populating the first region with one or more instances of the first design element. Act 906 can also involve identifying a composition of the first design element, and populating the first region with the one or more instances of the first design element in accordance with the identified composition of the first design element. In one or more embodiments, the composition includes one or more of a size, a density, or an arrangement of the first design element.

As part of act 906, or as an additional act, the method 900 can include determining one or more characteristics of the first region. Additionally, the method 900 can include identifying a composition of the first design element based on the determined one or more characteristics of the first region, and populating the first region with the one or more instances of the first design element in accordance with the identified composition of the first design element.

The method 900 also includes an act 908 of determining a state value for the first region. For example, act 908 involves determining a first state value for the first region based at least in part on the first design element. Act 908 can involve determining the first state value for the first region based on a style value of the first design element. Additionally, act 908 can involve determining the first state value for the first region based on a composition of the first design element, such as the size, density and/or arrangement of the first design element. Act 908 may also involve determining the first state value for the first region based on one or more characteristics of the first region.

The method 900 further includes an act 910 of generating a state value for a second region. For example, act 910 involves generating a second state value for the second region based on the first state value. To illustrate, act 910 may involve generating the second state value by adjusting the first state value by a predetermined value. Alternatively, act 910 may involve generating the second state value by adjusting the first state value by a random value within a threshold of the first state value. In another example, act 910 involves generating the second state value based on one or more characteristics of the second region relative to the first region.

Additionally, the method 900 includes an act 912 of identifying a second design element. For example, act 912 involves identifying a second design element from the plurality of design elements based on the second state value. To illustrate, act 912 can involve calculating a style value based on the second state value for the second region, and selecting the second design element from the plurality of design elements based on the calculated style value.

The method 900 includes an act 914 of populating the second region with the second design element. In one or more embodiments, act 914 involves identifying a composition of the second design element based on the second state value for the second region, and populating the second region with the second design element in accordance with the selected composition and style of the second design element.

The method 900 can further include generating a third state value for a third region from the plurality of regions based on the second state value, the third region adjacent to the second region. The method 900 can include identifying a third design element from the plurality of design elements based on the third state value, and populating the third region with one or more instances of the third design element.

Alternatively, the method 900 can include generating a third state value for a third region from the plurality of regions based on the first state value, the third region on a first side of the first region and the second region on a second side of the first region. The method 900 can include identifying a third design element from the plurality of design elements based on the third state value, and populating the third region with one or more instances of the third design element.

Additionally, the method 900 can include generating the second state value based on a third state value corresponding to a third region from the plurality of regions, the second region between the first region and the third region.

FIG. 10 illustrates a flowchart of a series of acts in a method of generating an object pattern design. The method 1000 includes an act 1002 of identifying an object containing a plurality of regions. For example, act 1002 involves identifying a first object from a set of training objects, the object comprising a plurality of regions. The set of training objects can include a plurality of turntable objects, each having a plurality of regions with different design elements.

The method 1000 also includes an act 1004 of detecting a first design element within a first region and a second design element within a second region. For example, act 1004 involves detecting a first design element within a first region of the plurality of regions and a second design element within a second region of the plurality of regions, the first region adjacent the second region.

The method 1000 further includes an act 1006 of generating state values for the first region and the second region. For example, 1006 involves generating a first state value for the first region based on the first design element and a second state value for the second region based on the second design element. Act 1006 can involve determining a composition and a style value of the first design element, and generating the first state value based on the composition and the style value of the first design element. Act 1006 can further involve determining a composition and a style value of the second design element, and generating the second state value based on the composition and the style value of the second design element. In one or more embodiments, the composition of the second design element includes a size, a density, or an arrangement of the second design element.

Additionally, the method 1000 includes an act 1008 of training a machine-learning model. For example, act 1008 involves training a sequence-based machine-learning model based on the first state value and the second state value. To illustrate, the sequence-based machine-learning model can include a hidden Markov model.

The method 1000 also includes an act 1010 of identifying a second object including a plurality of empty regions. For example, act 1010 can involve receiving a user selection of the second object via a user interface. Act 1010 can also involve generating a design template for the second object, the design template including a plurality of regions associated with the plurality of empty regions of the second object.

The method 1000 also includes an act 1012 of populating the regions in the second object. For example, act 1012 involves populating the plurality of empty regions in the second object using the trained sequence-based machine-learning model. To illustrate, act 1012 can involve receiving a design element selection for a first empty region from the plurality of empty regions, and populating remaining empty regions from the plurality of empty regions based on the received design element selection according to the trained sequential machine-learning model.

The method 1000 can also include identifying a plurality of design elements from the set of training objects. The method 1000 can include determining a style histogram for each design element from the plurality of design elements, comparing the style histograms for the plurality of design elements. Additionally, the method 1000 can include grouping the plurality of design elements into a plurality of clusters based on the style histograms for the plurality of design elements.

The method 1000 can also include assigning a style value to the style histogram for each design element from the plurality of design elements based on one or more curve parameters of the style histogram, and comparing the style values of the plurality of design elements. The method 1000 can additionally include determining one or more feature vectors for each design element from the plurality of design elements, and determining a kurtosis value from the one or more feature vectors for each design element from the plurality of design elements. The method 1000 further includes grouping the plurality of design elements into a plurality of clusters based on the kurtosis values for the plurality of design elements.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., a memory, etc.), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. In some embodiments, computer-executable instructions are executed on a general-purpose computer to turn the general-purpose computer into a special purpose computer implementing elements of the disclosure. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. In this description, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In this description and in the claims, a "cloud-computing environment" is an environment in which cloud computing is employed.

Figure 11:
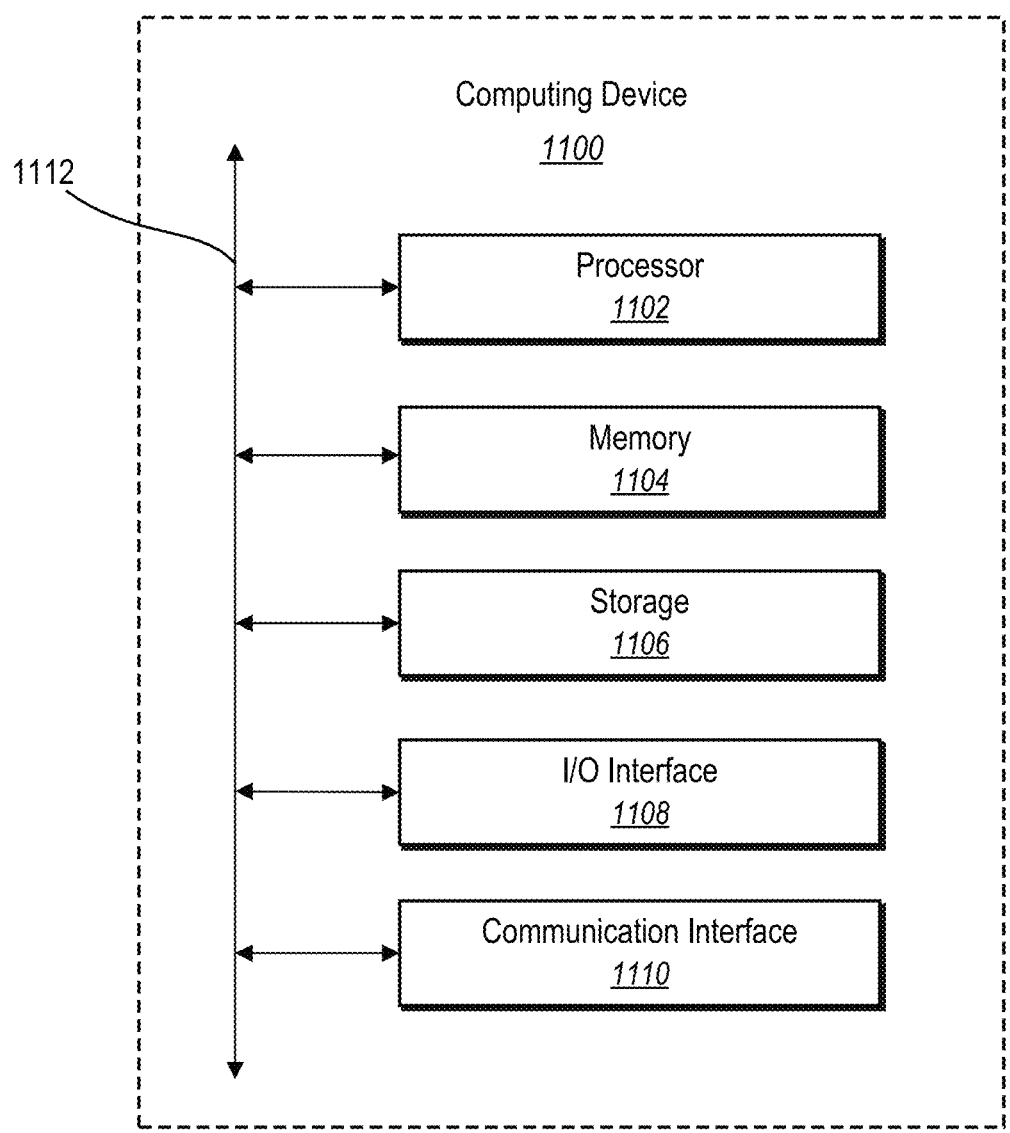
FIG. 11 illustrates a block diagram of an exemplary computing device in accordance with one or more embodiments.

FIG. 11 illustrates a block diagram of exemplary computing device 900 that may be configured to perform one or more of the processes described above. One will appreciate that one or more computing devices such as the computing device 1100 may implement the object design system 800. As shown by FIG. 11, the computing device 1100 can comprise a processor 1102, a memory 1104, a storage device 1106, an I/O interface 1108, and a communication interface 1110, which may be communicatively coupled by way of a communication infrastructure 1112. While an exemplary computing device 900 is shown in FIG. 11, the components illustrated in FIG. 11 are not intended to be limiting. Additional or alternative components may be used in other embodiments. Furthermore, in certain embodiments, the computing device 1100 can include fewer components than those shown in FIG. 11. Components of the computing device 1100 shown in FIG. 11 will now be described in additional detail.

In one or more embodiments, the processor 1102 includes hardware for executing instructions, such as those making up a computer program. As an example and not by way of limitation, to execute instructions, the processor 1102 may retrieve (or fetch) the instructions from an internal register, an internal cache, the memory 1104, or the storage device 1106 and decode and execute them. In one or more embodiments, the processor 1102 may include one or more internal caches for data, instructions, or addresses. As an example and not by way of limitation, the processor 1102 may include one or more instruction caches, one or more data caches, and one or more translation lookaside buffers (TLBs). Instructions in the instruction caches may be copies of instructions in the memory 1104 or the storage 1106.

The memory 1104 may be used for storing data, metadata, and programs for execution by the processor(s). The memory 1104 may include one or more of volatile and non-volatile memories, such as Random Access Memory ("RAM"), Read Only Memory ("ROM"), a solid state disk ("SSD"), Flash, Phase Change Memory ("PCM"), or other types of data storage. The memory 1104 may be internal or distributed memory.

The storage device 1106 includes storage for storing data or instructions. As an example and not by way of limitation, storage device 1106 can comprise a non-transitory storage medium described above. The storage device 1106 may include a hard disk drive (HDD), a floppy disk drive, flash memory, an optical disc, a magneto-optical disc, magnetic tape, or a Universal Serial Bus (USB) drive or a combination of two or more of these. The storage device 1106 may include removable or non-removable (or fixed) media, where appropriate. The storage device 1106 may be internal or external to the computing device 1100. In one or more embodiments, the storage device 1106 is non-volatile, solid-state memory. In other embodiments, the storage device 1106 includes read-only memory (ROM). Where appropriate, this ROM may be mask programmed ROM, programmable ROM (PROM), erasable PROM (EPROM), electrically erasable PROM (EEPROM), electrically alterable ROM (EAROM), or flash memory or a combination of two or more of these.

The I/O interface 1108 allows a user to provide input to, receive output from, and otherwise transfer data to and receive data from computing device 1100. The I/O interface 1108 may include a mouse, a keypad or a keyboard, a touch screen, a camera, an optical scanner, network interface, modem, other known I/O devices or a combination of such I/O interfaces. The I/O interface 1108 may include one or more devices for presenting output to a user, including, but not limited to, a graphics engine, a display (e.g., a display screen), one or more output drivers (e.g., display drivers), one or more audio speakers, and one or more audio drivers. In certain embodiments, the I/O interface 1108 is configured to provide graphical data to a display for presentation to a user. The graphical data may be representative of one or more graphical user interfaces and/or any other graphical content as may serve a particular implementation.

The communication interface 1110 can include hardware, software, or both. In any event, the communication interface 1110 can provide one or more interfaces for communication (such as, for example, packet-based communication) between the computing device 1100 and one or more other computing devices or networks. As an example and not by way of limitation, the communication interface 1110 may include a network interface controller (NIC) or network adapter for communicating with an Ethernet or other wire-based network or a wireless NIC (WNIC) or wireless adapter for communicating with a wireless network, such as a WI-FI.

Additionally or alternatively, the communication interface 1110 may facilitate communications with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, the communication interface 1110 may facilitate communications with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination thereof.

Additionally, the communication interface 1110 may facilitate communications various communication protocols. Examples of communication protocols that may be used include, but are not limited to, data transmission media, communications devices, Transmission Control Protocol ("TCP"), Internet Protocol ("IP"), File Transfer Protocol ("FTP"), Telnet, Hypertext Transfer Protocol ("HTTP"), Hypertext Transfer Protocol Secure ("HTTPS"), Session Initiation Protocol ("SIP"), Simple Object Access Protocol ("SOAP"), Extensible Mark-up Language ("XML") and variations thereof, Simple Mail Transfer Protocol ("SMTP"), Real-Time Transport Protocol ("RTP"), User Datagram Protocol ("UDP"), Global System for Mobile Communications ("GSM") technologies, Code Division Multiple Access ("CDMA") technologies, Time Division Multiple Access ("TDMA") technologies, Short Message Service ("SMS"), Multimedia Message Service ("MMS"), radio frequency ("RF") signaling technologies, Long Term Evolution ("LTE") technologies, wireless communication technologies, in-band and out-of-band signaling technologies, and other suitable communications networks and technologies.

The communication infrastructure 1112 may include hardware, software, or both that couples components of the computing device 1100 to each other. As an example and not by way of limitation, the communication infrastructure 1112 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination thereof.

In the foregoing specification, the present disclosure has been described with reference to specific exemplary embodiments thereof. Various embodiments and aspects of the present disclosure(s) are described with reference to details discussed herein, and the accompanying drawings illustrate the various embodiments. The description above and drawings are illustrative of the disclosure and are not to be construed as limiting the disclosure. Numerous specific details are described to provide a thorough understanding of various embodiments of the present disclosure.

The present disclosure may be embodied in other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel with one another or in parallel with different instances of the same or similar steps/acts. The scope of the present application is, therefore, indicated by the appended claims rather than by the foregoing description. All changes that come within the meaning and range of equivalency of the claims are to be embraced within their scope.

What is claimed is:

1. In a digital medium environment for generating an object pattern design, a method comprising:
   identifying a plurality of circular regions of a turntable object based on visual characteristics indicating visible borders of the plurality of circular regions, the plurality of circular regions comprising a first region adjacent a second region arranged concentrically around a center of the turntable object;
   receiving, via a graphical user interface, a user selection of a first design element from a plurality of design elements displayed within the graphical user interface;
   determining, by at least one processor, a first composition of the first design element, the first composition defining composition attributes of the first design element;
   populating, within the graphical user interface, the first region with a plurality of instances of the first design element based on the composition attributes of the first design element;
   determining, by the at least one processor utilizing a hidden Markov model to analyze the first design element and the first region, a first hidden state value of the first region based on the first design element and a location or a size of the first region, wherein the hidden Markov model comprises a machine-learning model trained on a plurality of training objects including a plurality of training design elements;
   generating, by the at least one processor utilizing the hidden Markov model, a second hidden state value for the second region based on the first hidden state value, an area of the second region, and a position of the second region relative to the first region;
   identifying, by the at least one processor, a second design element from the plurality of design elements based on the second hidden state value;
   determining, by the at least one processor, a second composition of the second design element, the second composition defining composition attributes of the second design element; and
   populating, within the graphical user interface, the second region with a plurality of instances of the second design element based on the composition attributes of the second design element.

2. The method as recited in claim 1, wherein determining the first composition of the first design element comprises determining a size value, a density value, and an arrangement value for the first design element.

3. The method as recited in claim 2, wherein populating the first region with the plurality of instances of the first design element comprises populating the first region with the plurality of instances according to the size value, the density value, and the arrangement value for the first design element.

4. The method as recited in claim 1, further comprising:
   determining at least one characteristic of the first region;
   determining the first composition of the first design element based on the at least one characteristic of the first region; and
   populating the first region with the plurality of instances of the first design element based on the composition attributes of the first design element.

5. The method as recited in claim 1, wherein determining the second composition of the second design element comprises determining the second composition based on the second hidden state value of the second region.

6. The method as recited in claim 1, further comprising:
   generating a third hidden state value of a third region from the plurality of circular regions based on the second hidden state value, the third region adjacent to the second region;
   identifying a third design element from the plurality of design elements based on the third hidden state value; and
   populating the third region with at least one instance of the third design element.

7. The method as recited in claim 1, further comprising:
   generating a third hidden state value of a third region from the plurality of circular regions based on the first hidden state value, the third region on a first side of the first region and the second region on a second side of the first region;

identifying a third design element from the plurality of design elements based on the third hidden state value; and populating the third region with at least one instance of the third design element.

8. The method as recited in claim 1, wherein generating the second hidden state value further comprises generating, utilizing the hidden Markov model, the second hidden state value based on a third hidden state value corresponding to a third region from the plurality of circular regions, the second region between the first region and the third region.

9. The method as recited in claim 1, wherein identifying the second design element from the plurality of design elements based on the second hidden state value comprises:
    calculating, utilizing the hidden Markov model, a style value based on the second hidden state value for the second region; and
    selecting the second design element from the plurality of design elements based on the calculated style value.

10. In a digital medium environment for generating an object pattern design, a method comprising:
    identifying a first object from images comprising a set of training objects, the object comprising a plurality of regions;
    detecting, by at least one processor utilizing image processing to analyze the images comprising the set of training objects, a first design element within a first region of the plurality of regions and a second design element within a second region of the plurality of regions, the first region adjacent the second region;
    generating, by the at least one processor, a first hidden state value for the first region based on the first design element and a location or a size of the first region and a second hidden state value for the second region based on the second design element and a location or a size of the second region, wherein the first hidden state value represents an overall design of the first region and the second hidden state value represents an overall design of the second region;
    training, by the at least one processor, a hidden Markov model based on determining a relationship between the first hidden state value and the second hidden state value;
    identifying a second object comprising a plurality of empty circular regions arranged concentrically around a center of the second object;
    generating, utilizing the trained hidden Markov model, a plurality of hidden state values comprising a hidden state value for each of the plurality of empty circular regions based on locations and sizes of the plurality of empty circular regions;
    determining, for the plurality of empty circular regions and based on the plurality of hidden state values, a plurality of design elements comprising a plurality of compositions defining composition attributes of the plurality of design elements for insertion into the plurality of empty circular regions; and
    populating, within a graphical user interface and by the at least one processor, the plurality of empty circular regions in the second object with the plurality of design elements based on the plurality of compositions for the plurality of design elements.

11. The method as recited in claim 10, further comprising:
    identifying a plurality of training design elements from the set of training objects;
    determining a style histogram for each design element from the plurality of training design elements;
    comparing the style histograms for the plurality of training design elements; and
    grouping the plurality of design elements into a plurality of clusters based on the style histograms for the plurality of training design elements.

12. The method as recited in claim 11, wherein comparing the style histograms for the plurality of training design elements comprises:
    assigning a style value to the style histogram for each design element from the plurality of training design elements based on at least one curve parameter of the style histogram; and
    comparing the style values of the plurality of training design elements.

13. The method as recited in claim 11, further comprising:
    determining a plurality of feature vectors for each design element from the plurality of training design elements;
    determining a kurtosis value from the plurality of feature vectors for each design element from the plurality of training design elements; and
    grouping the plurality of training design elements into a plurality of clusters based on the kurtosis values for the plurality of training design elements.

14. The method as recited in claim 10, wherein generating the first hidden state value and the second hidden state value comprises:
    determining a composition and a style value of the first design element;
    generating the first hidden state value based on the composition and the style value of the first design element;
    determining a composition and a style value of the second design element; and
    generating the second hidden state value based on the composition and the style value of the second design element.

15. The method as recited in claim 14, wherein the composition of the second design element comprises a size, a density, or an arrangement of the second design element.

16. The method as recited in claim 10, further comprising:
    receiving a design element selection for a first empty circular region from the plurality of empty circular regions;
    generating the plurality of hidden state values by generating, for the first empty circular region and utilizing the trained hidden Markov model, a first hidden state value of the plurality of hidden state values based on the design element selection and a location and a size of the first empty circular region; and
    populating remaining empty circular regions from the plurality of empty circular regions based on the plurality of hidden state values including the first hidden state value.

17. In a digital medium environment for selecting an object pattern design, a system comprising:
    at least one processor;
    at least one non-transitory computer-readable storage medium storing instructions thereon that, when executed by the at least one processor, cause the system to:
        identifying a plurality of training objects in a plurality of images, each training object from the plurality of training objects comprising a plurality of regions;
        detecting, by analyzing the plurality of images using image processing, a plurality of training design elements associated with the plurality of regions of the plurality of training objects;

training a hidden Markov model based on relationships between each training design element of the detected plurality of training design elements;

identify a plurality of circular regions of a turntable object based on visual characteristics indicating visible borders of the plurality of circular regions, the plurality of circular regions comprising a first region adjacent a second region arranged concentrically around a center of the turntable object;

receive, via a graphical user interface, a user selection of a first design element from a plurality of design elements;

determine, utilizing the hidden Markov model, a first hidden state value for the first region based on the first design element and a location and a size of the first region;

determine, utilizing the hidden Markov model, a second hidden state value for the second region based on the first hidden state value, an area of the second region, and a position of the second region relative to the first region;

identify a second design element for insertion into the second region from the plurality of design elements based on the second hidden state value; and populate, within the graphical user interface, the second region with a plurality of instances of the second design element.

18. The system as recited in claim 17, further comprising instructions that, when executed by the at least one processor, cause the system to determine the first hidden state value for the first region based on a composition and a style value of the first design element.

19. The system as recited in claim 18, further comprising instructions that, when executed by the at least one processor, cause the system to:

determine a location or a size of the first region;

select the composition of the first design element based on the location and the size the first region, the composition of the first design element defining composition attributes of the first design element; and populate, within the graphical user interface, the first region with the plurality of instances of the first design element in accordance with the composition attributes of the first design element.

20. The system as recited in claim 17, further comprising instructions that, when executed by the at least one processor, cause the system to identify the second design element from the plurality of design elements, wherein identifying the second design element comprises:

identifying a group of design elements having similar feature vectors to the first design element; and selecting the second design element from the group of design elements.

* * * * *